United States Patent
Lee et al.

(10) Patent No.: US 11,555,240 B2
(45) Date of Patent: Jan. 17, 2023

(54) BLACK PLATED STEEL SHEET AND MANUFACTURING METHOD THEREOF

(71) Applicants: POSCO, Pohang-si (KR); RESEARCH INSTITUTE OF INDUSTRIAL SCIENCE & TECHNOLOGY, Pohang-si (KR)

(72) Inventors: Kyung Hwang Lee, Incheon (KR); Jae In Jeong, Pohang-si (KR); Hye Jeong Kim, Pohang-si (KR); Ji Hoon Yang, Pohang-si (KR)

(73) Assignees: POSCO HOLDINGS INC., Seoul (KR); RESEARCH INSTITUTE OF INDUSTRIAL SCIENCE & TECHNOLOGY, Pohang-si (KR)

( * ) Notice: Subject to any disclaimer, the term of this patent is extended or adjusted under 35 U.S.C. 154(b) by 11 days.

(21) Appl. No.: 17/128,465

(22) Filed: Dec. 21, 2020

(65) Prior Publication Data
US 2021/0189552 A1    Jun. 24, 2021

(30) Foreign Application Priority Data
Dec. 20, 2019  (KR) .................. 10-2019-0171873

(51) Int. Cl.
*C22C 21/02*   (2006.01)
*C23C 14/58*   (2006.01)
*C23C 14/16*   (2006.01)
*C23C 14/24*   (2006.01)

(52) U.S. Cl.
CPC .......... *C23C 14/5806* (2013.01); *C22C 21/02* (2013.01); *C23C 14/16* (2013.01); *C23C 14/24* (2013.01)

(58) Field of Classification Search
None
See application file for complete search history.

(56) References Cited

U.S. PATENT DOCUMENTS

| | | | |
|---|---|---|---|
| 9,863,027 B2 * | 1/2018 | Nakano | ................. C23C 28/321 |
| 2010/0028572 A1 * | 2/2010 | Kobayashi | ............ C04B 41/009 |
| | | | 501/153 |

FOREIGN PATENT DOCUMENTS

| | | |
|---|---|---|
| JP | S6456881 | 3/1989 |
| JP | 10226861 | 8/1998 |
| JP | 2011182597 | 9/2011 |
| JP | 5335159 | 11/2013 |
| JP | 2013241671 | 12/2013 |
| JP | 5901389 | 4/2016 |
| JP | 6121227 | 4/2017 |
| JP | 2017145441 | 8/2017 |
| KR | 20140128464 | 11/2014 |
| KR | 20150002669 | 1/2015 |
| KR | 20180071108 | 6/2018 |

(Continued)

OTHER PUBLICATIONS

Korean Office Action—Korean Application No. 10-2019-0171873 dated Apr. 7, 2021, citing JP 2017-145441 and JP 10-226861.

*Primary Examiner* — Daniel J. Schleis
(74) *Attorney, Agent, or Firm* — Cantor Colburn LLP

(57) ABSTRACT

A black plated steel sheet includes a steel sheet and an Al—Mg—Si-based plating layer disposed on one surface or both surfaces of the steel sheet; in which the plating layer includes a black layer on the outermost surface thereof, and the black layer has a weight ratio of O to (Al+Mg+Si+O) of 0.01 to 0.6.

14 Claims, 48 Drawing Sheets

(56) References Cited

FOREIGN PATENT DOCUMENTS

| KR | 101883404 | 7/2018 |
|----|-----------|--------|
| KR | 20190121761 | 10/2019 |

* cited by examiner

After blackening

Before blackening

BLACK PLATED STEEL SHEET AND MANUFACTURING METHOD THEREOF

TECHNICAL FIELD

An exemplary embodiment of the present invention relates to a black plated steel sheet and a manufacturing method thereof. Specifically, an exemplary embodiment of the present invention relates to a black plated steel sheet having excellent design, white rust resistance, and red rust resistance by heat-treating a plated steel sheet including an Al—Mg—Si plating layer in a high-pressure and high-humidity atmosphere to subject the plated steel sheet to blackening treatment, and a manufacturing method thereof.

BACKGROUND ART

In the fields such as roofing materials and exterior materials for buildings, home appliances, and automobiles, there is an increasing need for steel sheet having a black appearance from the viewpoint of design. Examples of a method of blackening the surface of a steel sheet include a method of forming a black coating film by applying a black paint to the surface of the steel sheet. However, in the above fields, plated steel sheets plated with Zn plating, or Al-containing Zn plating, Al and Mg-containing Zn plating, Si-containing Al plating, and Mg and Si-containing Al plating, and the like are often used from the viewpoint of corrosion resistance, and the surface of such a plated steel sheet has a silvery white hue with a metallic luster. Therefore, in order to obtain a highly designed black appearance by applying a black paint, the coating film needs to be thickened to hide the base color, thereby increasing the painting cost. Further, when the coating film is thickened as described above, there is also a problem in that resistance welding such as spot welding cannot be performed.

As a method of shielding the metallic luster and silvery white hue of the plated steel sheet without forming a black coating film, a method of blackening the plating layer itself has been proposed. Specifically, a method of spraying high-temperature steam on a molten Al-containing Zn-plated steel sheet to form a thin black film on the surface layer of the plating layer is disclosed. However, in this method, Zn is essentially contained in the plating layer, and easily reacts with corrosive ions such as Cl$^-$ present in the atmosphere to form a white corrosion product, so that there is a problem in that white rust resistance deteriorates after blackening treatment.

DISCLOSURE

Technical Problem

The present invention has been made in an effort to provide a black plated steel sheet and a manufacturing method thereof. Specifically, the present invention has been made in an effort to provide a black plated steel sheet having excellent design, white rust resistance, and red rust resistance by heat-treating a plated steel sheet including an Al—Mg—Si plating layer in a high-pressure and high-humidity atmosphere to subject the plated steel sheet to blackening treatment, and a manufacturing method thereof.

Technical Solution

The black plated steel sheet according to an exemplary embodiment of the present invention includes a steel sheet and an Al—Mg—Si-based plating layer disposed on one surface or both surfaces of the steel sheet; the plating layer includes a black layer on the outermost surface thereof, and a weight ratio of O to (Al+Mg+Si+O) is 0.01 to 0.6 from the outermost surface of the Al—Mg—Si-based plating layer to a thickness of 2 μm in the internal direction.

The black layer may at least partially include a non-black portion including $Mg_2Si$.

The black layer may contain Si oxides, Si—Al composite oxides, Si—Mg composite oxides or Si—Al—Mg composite oxides, or hydroxides thereof.

The black layer may further include Mg oxides, Al oxides, or Mg—Si composite oxides, or hydroxides thereof.

The black layer may include 60 to 85 wt % of O.

The black layer may further include 5 to 15 wt % of Al, 5 to 30 wt % of Mg, and 0.1 to 10 wt % of Si.

The black layer may have a thickness of 0.5 to 5 μm.

The black layer may have a brightness L* of 60 or less.

The Al—Mg—Si-based plating layer may include an Al—Mg alloy matrix and Mg—Si alloy particles.

The Al—Mg—Si-based plating layer may include 40 to 90 wt % of Al, 1 to 40 wt % of Mg, 1 to 15 wt % of Si, and the balance Fe.

An Al—Si alloy layer or an Al—Fe—Si alloy layer may be further included between the Al—Mg—Si-based plating layer and the steel sheet.

An inorganic film or an organic film disposed on the Al—Mg—Si plating layer may be further included.

The inorganic film may include one or more of oxides, oxysalts, hydroxides, phosphates, and fluorides of one or more of Ti, Zr, Hf, V, Nb, Ta, W, Si, and Al.

The organic film may include a urethane resin obtained by reacting a polyol consisting of an ether-based polyol and an ester-based polyol with a polyisocyanate.

An exemplary embodiment of the present invention provides a method for manufacturing a black plated steel sheet, the method including: manufacturing an alloy plated steel sheet by forming an Al—Mg—Si-based plating layer on one surface or both surfaces of a steel sheet; a steam introduction step of charging a sealed vessel with the alloy plated steel sheet and introducing steam into the sealed vessel; and heat-treating the alloy plated steel sheet in the sealed vessel to subject the alloy plated steel sheet to blackening treatment.

A weight ratio of Mg to (Al+Mg) may be 0.05 to 1.00 from the surface of the Al—Mg—Si-based plating layer to a thickness of 2 μm in the internal direction.

The Al—Mg—Si-based plating layer may include 40 to 90 wt % of Al, 1 to 40 wt % of Mg, 1 to 15 wt % of Si, and the balance.

The Al—Mg—Si-based plating layer may have a thickness of 5 to 20 μm.

The alloy plated steel sheet may further include an Al—Si alloy layer or an Al—Fe—Si alloy layer between the Al—Mg—Si-based plating layer and the steel sheet.

Prior to the steam introduction step, the $Mg_2Si$ forming step of at least partially forming $Mg_2Si$ by heat-treating the alloy plated steel sheet may be further included.

In the $Mg_2Si$ forming step, a heat treatment temperature may be 300 to 400° C., and a heat treatment time may be 1 minute and 30 seconds.

In the steam introduction step, steam may be introduced such that a pressure in the sealed vessel is 3.0 to 10.0 bar.

In the heat-treatment step, a humidity in the sealed vessel may be maintained at 50 to 98 RH %.

In the heat-treatment step, a heat treatment temperature may be 100 to 200° C.

The black plated steel sheet according to an exemplary embodiment of the present invention is subjected to blackening treatment, and thus has excellent design, white rust resistance, and red rust resistance.

The black plated steel sheet according to an exemplary embodiment of the present invention has excellent black appearance retention after processing.

The black plated steel sheet according to an exemplary embodiment of the present invention may be usefully used as a plated steel sheet used for roofing materials and exterior materials for buildings, home appliances, automobiles, and the like.

MODE FOR INVENTION

The terminology used herein is for reference only to specific embodiments and is not intended to limit the invention. The singular forms used herein include plural forms as well, unless the phrases clearly indicate the opposite. The meaning of "comprising" used in the specification embodies specifies specific features, regions, integers, steps, operations, elements and/or components, and does not exclude the presence or the addition of other features, regions, integers, steps, operations, elements and/or components.

When a portion is referred to as being "above" or "on" another portion, it may be directly above or on another portion or may be accompanied by yet another portion disposed in between. In contrast, when a portion is referred to as being "directly above" another portion, no other portion is interposed in between.

Unless otherwise defined, all terms including technical and scientific terms used herein have the same meaning as commonly understood by those with ordinary knowledge in the art to which this invention belongs. Terms defined in the general dictionaries are not to be construed as the ideal or very formal meanings unless they are further interpreted and defined as having a meaning consistent with the relevant technical literature and the present disclosure.

In addition, unless otherwise stated, % means wt %, and 1 ppm is 0.0001 wt %.

In an exemplary embodiment of the present invention, the meaning further comprising an additional element in the component means that the element that is the balance is included by replacing the amount of additional element added.

Hereinafter, exemplary embodiments of the present invention will be described in detail such that those skilled in the art can easily carry out the present invention. As those skilled in the art would realize, the described embodiments may be modified in various different ways, all without departing from the spirit or scope of the present invention.

An exemplary embodiment of the present invention improves the design, white rust resistance, and red rust resistance by subjecting a plated steel sheet including an Al—Mg—Si plating layer to blackening treatment in a high-pressure and high-humidity atmosphere.

The black plated steel sheet according to an exemplary embodiment of the present invention includes a steel sheet and an Al—Mg—Si-based plating layer disposed on one surface or both surfaces of the steel sheet; and the plating layer includes a black layer on the outermost surface thereof.

Figure 1:
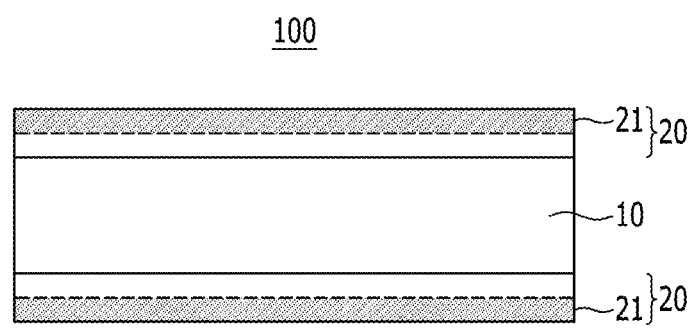
FIG. 1 is a schematic view of the cross-section of a black plated steel sheet according to an exemplary embodiment of the present invention.

FIG. 1 illustrates a schematic view of the cross-section of a black plated steel sheet according to an exemplary embodiment of the present invention.

As illustrated in FIG. 1, a black plated steel sheet 100 includes a steel sheet 10 and an Al—Mg—Si-based plating layer 20 disposed on one surface or both surfaces of the steel sheet 10. The plating layer 20 includes a black layer 21 on the outermost layer thereof. FIG. 1 illustrates an example in which the plating layer (20) and a black layer (21) are disposed on both sides of the steel sheet.

The steel sheet 10 can be used without limitation as long as the steel sheet 10 can form the plating layer 20. As an example, carbon steel may be used.

In an exemplary embodiment of the present invention, the plating layer 20 includes a black layer 21 including 60 to 85 wt % of oxygen (O). The black layer (21) is distinguished from the plating layer 20 which is not the black layer (21) including less than 60 wt % of O in O content. In an exemplary embodiment of the present invention, for the Al—Mg—Si-based plating layer 20 and the black layer 21, elemental components may have a concentration gradient in the thickness direction. Unless otherwise described, alloy components mean the average content in total thickness. If there is too little O in the black layer (21), blackening may not be appropriately performed. More specifically, the black layer 21 may include 65 to 80 wt % of O.

The black layer 21 includes a black portion and a non-black portion. The non-black portion consists of Mg$_2$Si. The black portion does not include Mg$_2$Si, but includes an Al—Mg alloy matrix and a Mg—Si alloy matrix. Such black and non-black portions may be patterned.

The non-black portion may be formed by heat-treating an alloy-plated steel sheet to at least partially form Mg$_2$Si prior to the steam injection step, as described in the method for manufacturing the black plated steel sheet 100 to be described below.

The black layer 21 may further include 5 to 15 wt % of Al, 5 to 30 wt % of Mg, and 0.1 to 10 wt % of Si. By including Al and Mg in the above-described range, there is an advantage in that the plated steel sheet is blackened. By including Si in the above-described range, the plated steel sheet is advantageous in terms of white rust resistance. In particular, as compared to the case where Zn is included, the plated steel sheet is advantageous in terms of white rust resistance because a white zinc corrosion product is not produced. More specifically, the black layer 21 may further include 7 to 13 wt % of Al, 10 to 25 wt % of Mg, and 1 to 3 wt % of Si.

The black layer 21 may include Si oxides, Si—Al composite oxides, Si—Mg composite oxides, or Si—Al—Mg composite oxides, or hydroxides thereof produced by combining oxygen (O) with Si. Specifically, the content of Si in Si oxides, Si—Al composite oxides, Si—Mg composite oxides, or Si—Al—Mg composite oxides, or hydroxides thereof may be 0.1 to 10 wt % based on 100 wt % of the black layer 21. Since Si oxides, Si—Al composite oxides, Si—Mg composite oxides or Si—Al—Mg composite oxides or hydroxides thereof are appropriately present, the plated steel sheet is advantageous in terms of white rust resistance. More specifically, Si in Si oxides, Si—Al composite oxides, Si—Mg composite oxides, or Si—Al—Mg composite oxides, or hydroxides thereof may be 0.5 to 5 wt %. Hydroxides thereof mean Si hydroxides, Si—Al composite hydroxides, Si—Mg composite hydroxides, or Si—Al—Mg composite hydroxides.

The black layer 21 may further include Mg oxides, Al oxides or Mg—Si composite oxides or hydroxides thereof.

The black layer 21 is formed by contacting the plating layer 20 with steam, as described in a method for manufacturing a black plated steel sheet 100 to be described below. A more detailed description will be given in the method for manufacturing a black plated steel sheet 100.

The black layer 21 may be partially present in the direction of the contact surface of the steel sheet 10 and the plating layer 20 from the outermost surface of the plating layer 20. In this case, the black layer 21 may have a thickness of 0.5 μm to 5.0 μm. More specifically, the black layer 21 may have a thickness of 1.0 to 3.0 μm. The thickness of the black layer 21 may be 5 to 75% of the total thickness of the plating layer 20. More specifically, the thickness of the black layer 21 may be 20 to 60% of the total thickness of the plating layer 20.

The black layer 21 according to an exemplary embodiment of the present invention may have a brightness L* of 60 or less. The brightness may be measured in accordance with the ASTM E 1164 method using a spectrophotometer. More specifically, the brightness may be 40 or less. More specifically, the brightness may be 30 or less.

The black layer 21 according to an exemplary embodiment of the present invention may have a chromaticity a* of −1.4 to 2.4 and a chromaticity b* of 0.8 to 13.4.

The plating layer 20 includes the black layer 21, and is disposed on one surface or both surfaces of the steel sheet 10.

The plating layer 20 includes Al, Mg, and Si. Specifically, the plating layer 20 may include 40 to 90 wt % of Al, 1 to 40 wt % of Mg, and 1 to 15 wt % of Si. More specifically, the plating layer 20 may include 40 to 70 wt % of Al, 20 to 40 wt % of Mg, 5 to 15 wt % of Si, and the balance Fe. As described above, for the Al—Mg—Si-based plating layer 20, elemental components may have a concentration gradient in the thickness direction. Unless otherwise described, alloy components mean an average content in the total thickness. Since the plating layer 20 includes the black layer 21, the content of the plating layer 20 means the average content including the black layer 21.

By including Al and Mg in the above range, there is an advantage in terms of blackening the plated steel sheet.

Further, by including Si in the above range, the plated steel sheet is advantageous in terms of white rust resistance.

Fe may diffuse from the steel sheet 10 during the plating process and heat treatment process of the plating layer 20. Specifically, 5 to 10 wt % of Fe may be included.

results from naturally generated oxides when the surface of the plated steel sheet is exposed to the atmosphere. O may be included in an amount of 10 wt % or less.

In addition to the above-described elements, N, C, Zn, and the like may be included in an amount of 1 wt % or less. Other inevitable elements may be further included, and since the inevitable elements and content ranges thereof are widely known in the metal field, detailed description thereof will be omitted.

The plating layer 20 means a layer from the outermost surface of the black plated steel sheet 100 to the thickness in which Al is included in a larger amount than Fe in the thickness direction. The steel sheet 10 means the internal direction from the point at which Al is present in an amount smaller than or the same as that of Fe.

The plating layer 20 may have a thickness of 5 to 20 μm. When the plating layer 20 is too thin, the corrosion resistance may deteriorate due to the loss of the plating layer during processing such as hairline and vibration for improving the surface design of the plating layer. When the thickness of the plating layer 20 is too thick, conversely, there may occur a problem in that when a black plated steel sheet product is processed, cracks are generated in the plating layer, or the coating layer treated on the plating layer peels off. More specifically, the plating layer 20 may have a thickness of 5 μm to 15 μm.

The plating layer 20 except for the black layer 21 may include an Al—Mg alloy matrix and Mg—Si alloy particles.

A weight ratio of O to (Al+Mg+Si+O) is 0.01 to 0.60 from the outermost surface of the Al—Mg—Si-based plating layer 20 to a thickness of 2 μm in the internal direction.

As described above, since the thickness of the black layer 21 is 0.5 to 5 μm, the thickness of 2 μm from the outermost surface mm in the internal direction may or may not correspond to the black layer 21.

When the above ratio is too small, blackening may not be sufficient. When the above ratio is too large, the L value increases from black to gray, and thus, blackening may not be sufficient. More specifically, the weight ratio of O to (Al+Mg+Si+O) may be 0.15 to 0.60. More specifically, the weight ratio may be 0.25 to 0.40.

A weight ratio of Mg to Al may be 0.03 to 10.0 from the outermost surface of the Al—Mg—Si-based plating layer 20 to a thickness of 2 μm in the internal direction. More specifically, the weight ratio may be 0.30 to 5.0.

A weight ratio of Mg to (Al+Mg) may be 0.04 to 1.0 from the outermost surface of the Al—Mg—Si-based plating layer 20 to a thickness of 2 μm in the internal direction. More specifically, the weight ratio may be 0.25 to 0.90.

Figure 2:
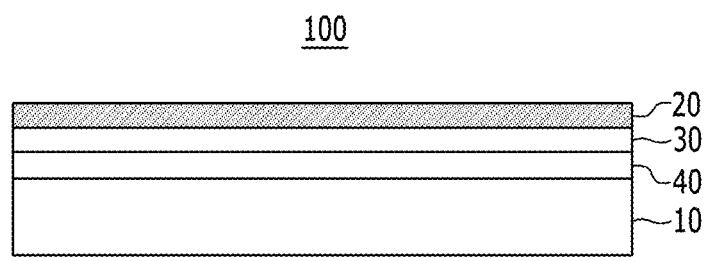
FIG. 2 is a schematic view of the cross-section of a black plated steel sheet according to another exemplary embodiment of the present invention.

More specifically, the Al—Mg—Si-based plating layer 20 may include 0.1 to 90 wt % of Al, 1.0 to 60 wt % of Mg, 0.1 to 10 wt % of Si, and 2 to 60 wt % of O from the outermost surface thereof to a thickness of 2 μm in the internal direction. More specifically, the Al—Mg—Si-based plating layer 20 may include 0.5 to 60 wt % of Al, 10 to 60 wt % of Mg, 0.1 to 5.5 wt % of Si, and 15 to 60 wt % of O from the outermost surface thereof to a thickness of 2 μm in the internal direction. FIG. 2 is a schematic view of the cross-section of a black plated steel sheet according to another exemplary embodiment of the present invention.

The black plated steel sheet 100 according to another exemplary embodiment of the present invention may further include an Al—Si alloy 30 or an Al—Fe—Si alloy layer 40 between the Al—Mg—Si-based plating layer 20 and the steel sheet 10. As illustrated in FIG. 2, the steel sheet 10, the Al—Si alloy layer 30, the Al—Fe—Si alloy layer 40, and the Al—Mg—Si-based plating layer 20 may be laminated in this order.

The Al—Si alloy layer 30 may include 80 to 95 wt % of Al and 5 to 15 wt % of Si. The Al—Si—Fe alloy layer 40 may include 40 to 55 wt % of Al, 30 to 50 wt % of Fe, and 5 to 15 wt % of Si.

Although not shown in FIG. 2, a Mg plating layer may be further included on the Al—Mg—Si-based plating layer (20). The Mg plating layer may be included in the black layer 21, and may include 10 to 30 wt % of Mg and 70 to 90 wt % of O.

Figure 3:
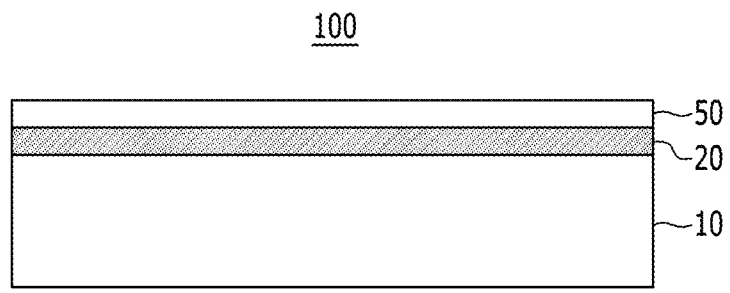
FIG. 3 is a schematic view of the cross-section of a black plated steel sheet according to still another exemplary embodiment of the present invention.
Figure 4:
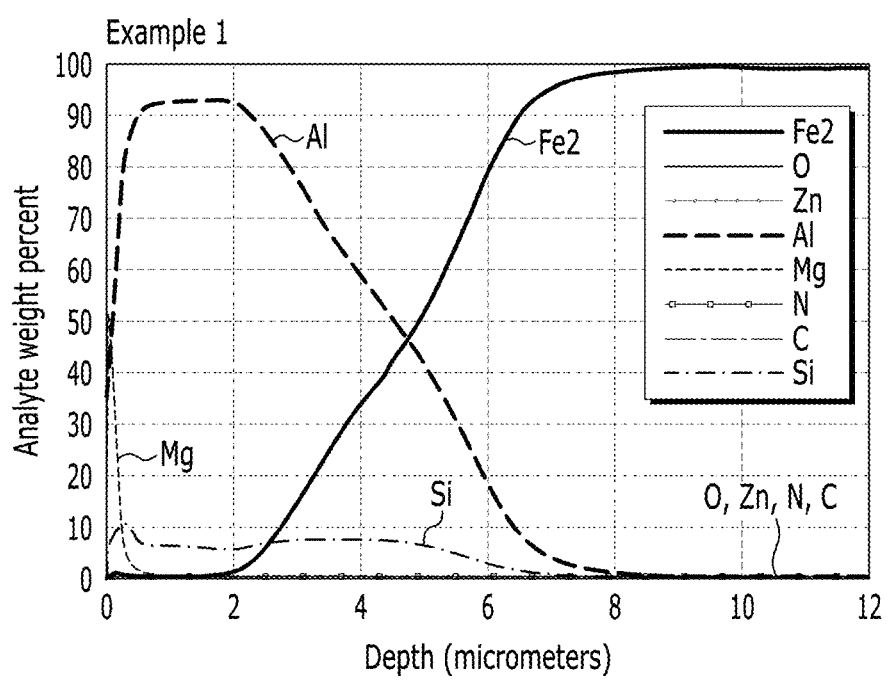
FIGS. 4 and 5 illustrate analysis results and a surface photograph of the alloy components of the plated steel sheet manufactured in Example 1 in the depth direction, respectively.
Figure 5:
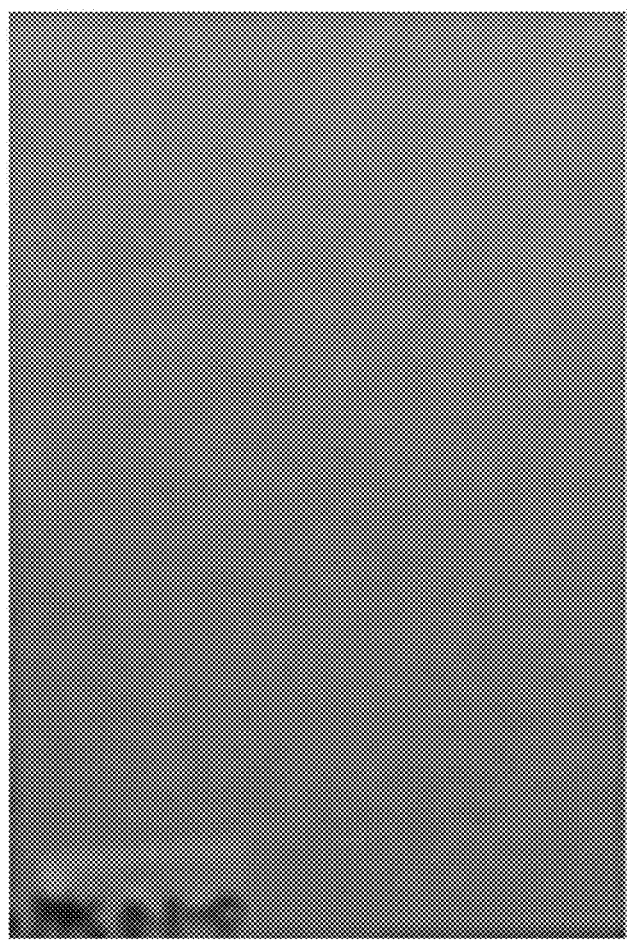
Figure 6:
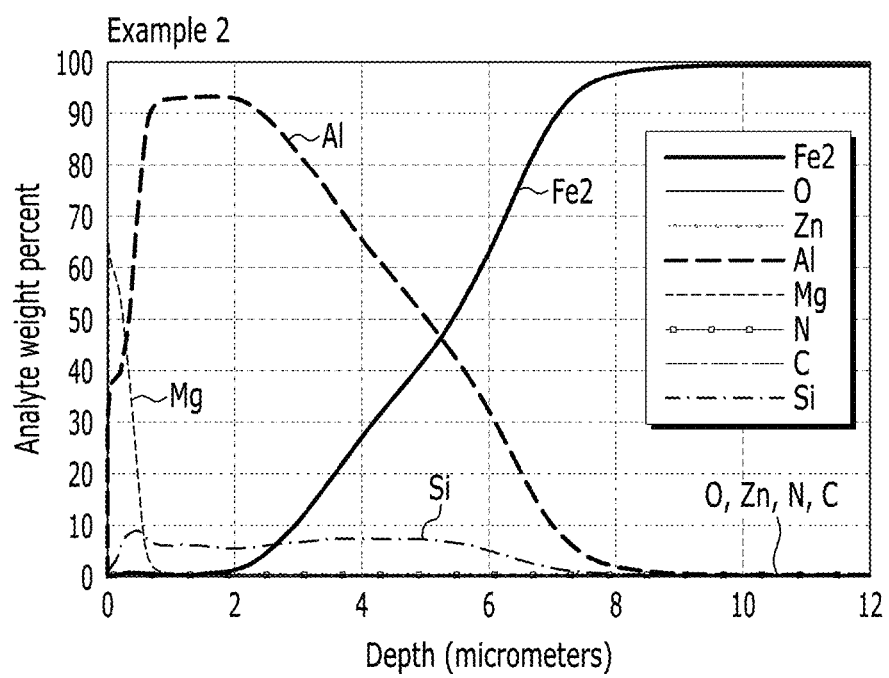
FIGS. 6 and 7 illustrate analysis results and a surface photograph of the alloy components of the plated steel sheet manufactured in Example 2 in the depth direction, respectively.
Figure 7:
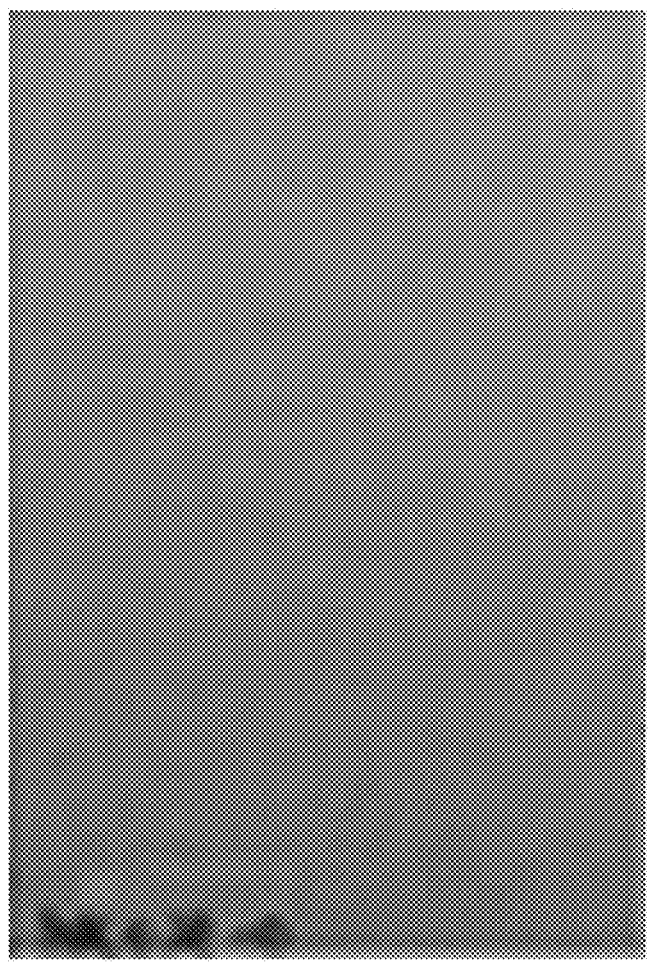
Figure 8:
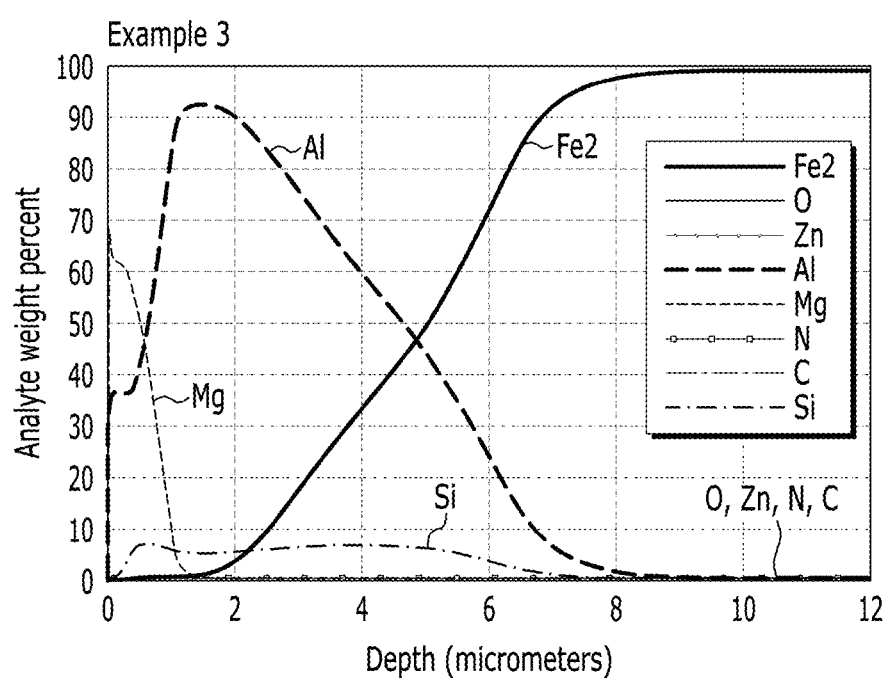
FIGS. 8 and 9 illustrate analysis results and a surface photograph of the alloy components of the plated steel sheet manufactured in Example 3 in the depth direction, respectively.
Figure 9:
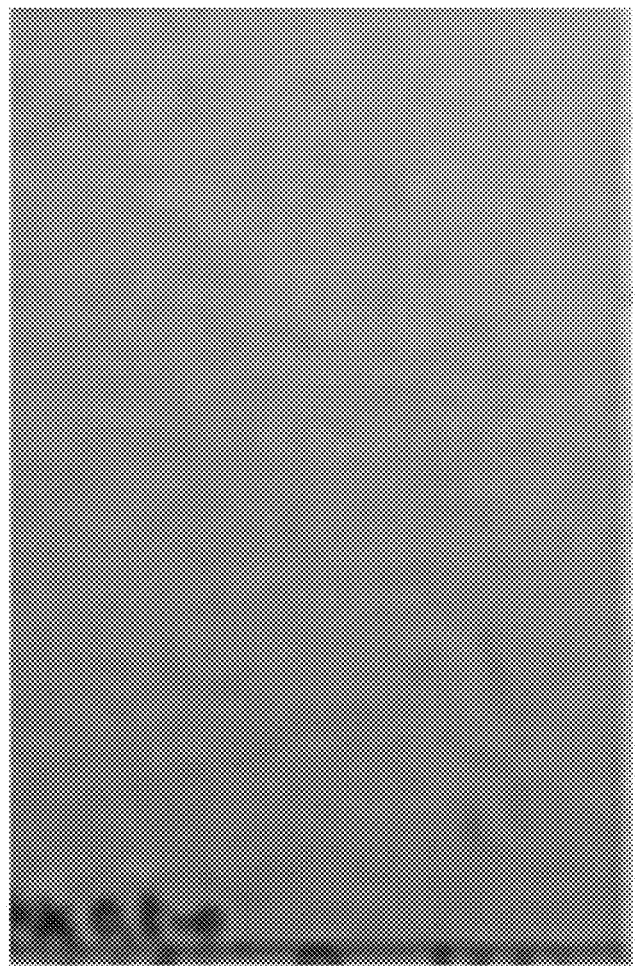
Figure 10:
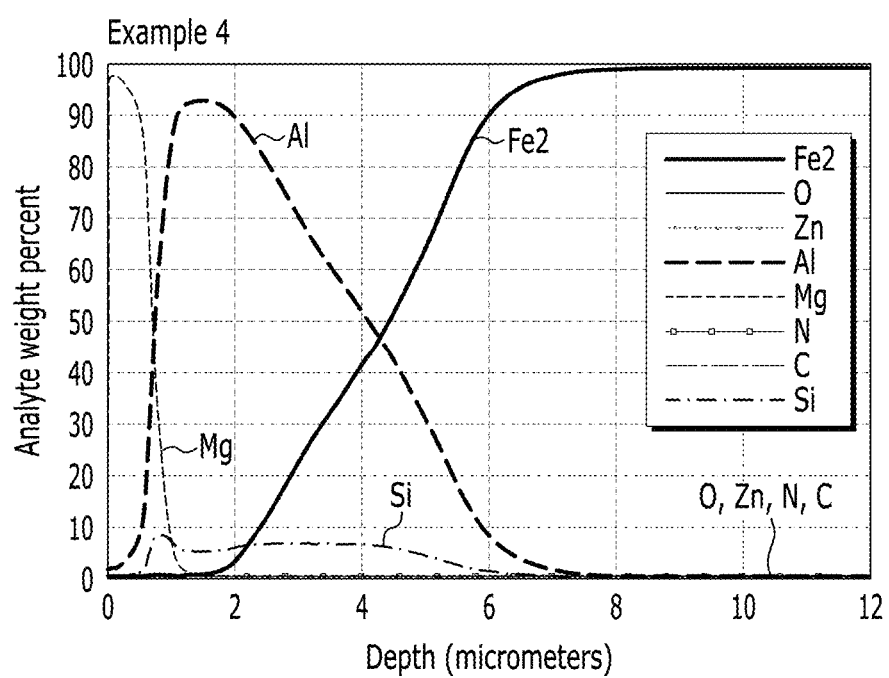
FIGS. 10 and 11 illustrate analysis results and a surface photograph of the alloy components of the plated steel sheet manufactured in Example 4 in the depth direction, respectively.
Figure 11:
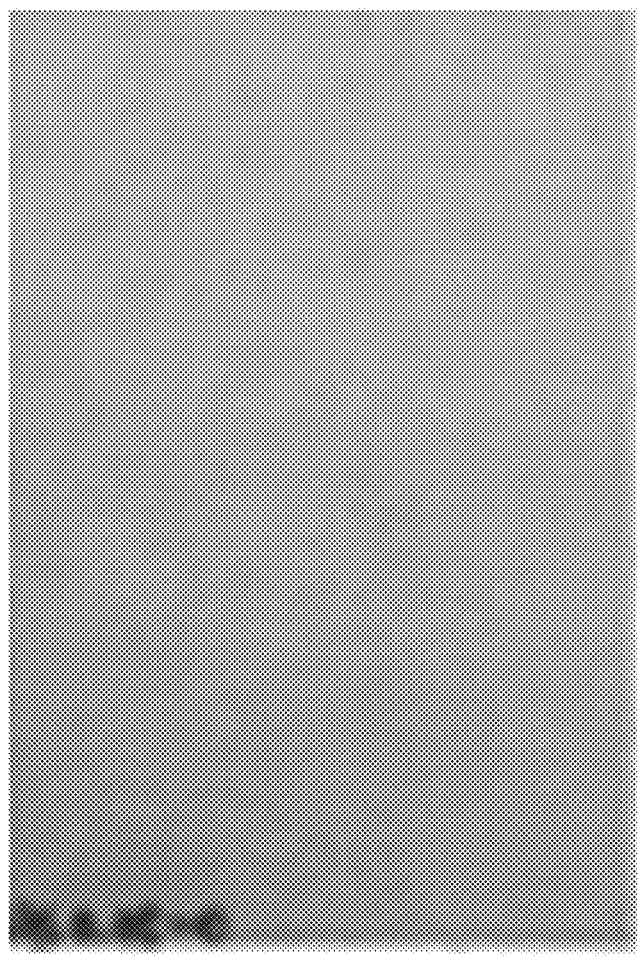
Figure 12:
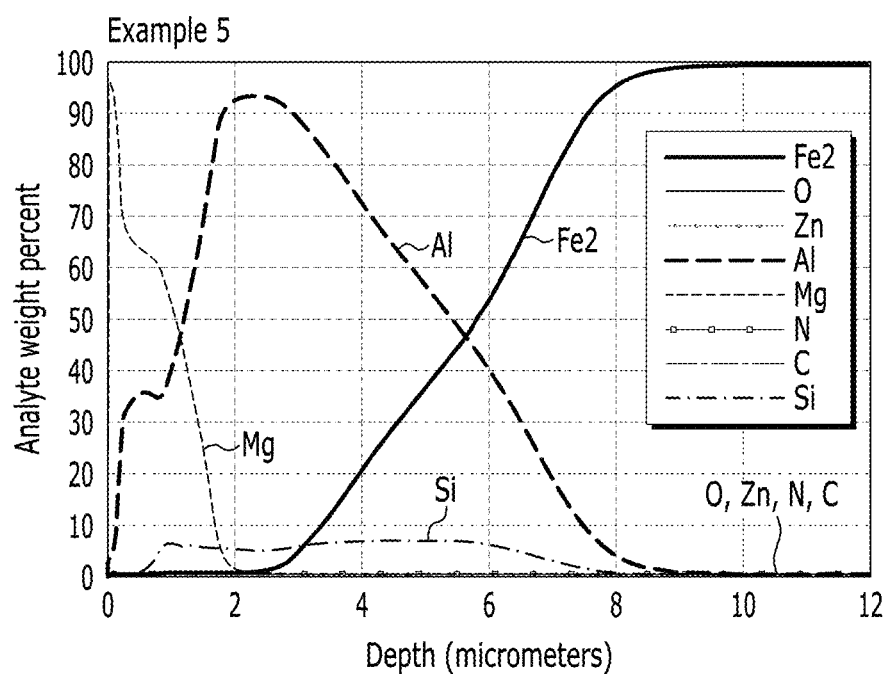
FIGS. 12 and 13 illustrate analysis results and a surface photograph of the alloy components of the plated steel sheet manufactured in Example 5 in the depth direction, respectively.
Figure 13:
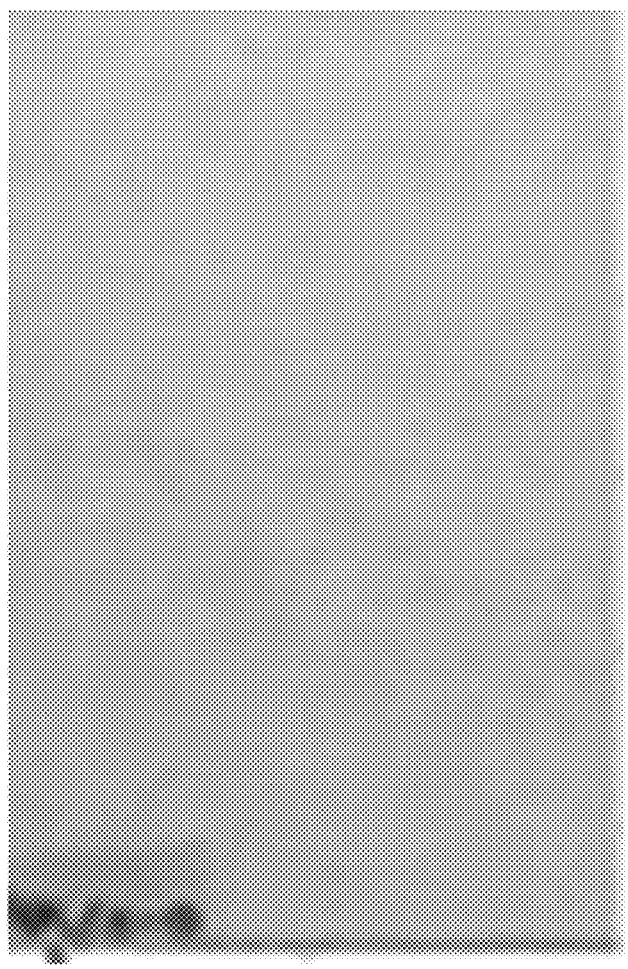
Figure 14:
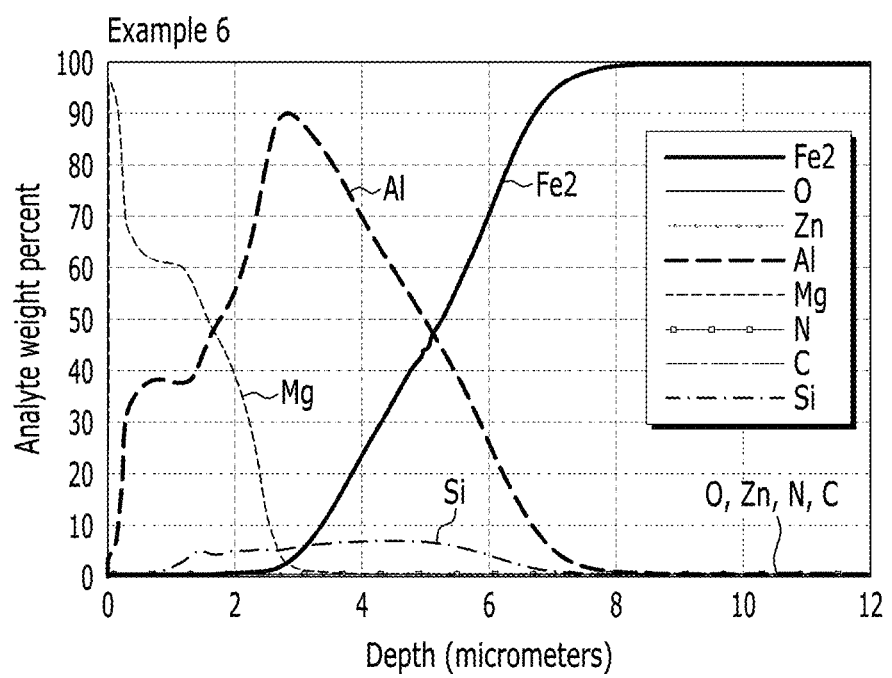
FIGS. 14 and 15 illustrate analysis results and a surface photograph of the alloy components of the plated steel sheet manufactured in Example 6 in the depth direction, respectively.
Figure 15:
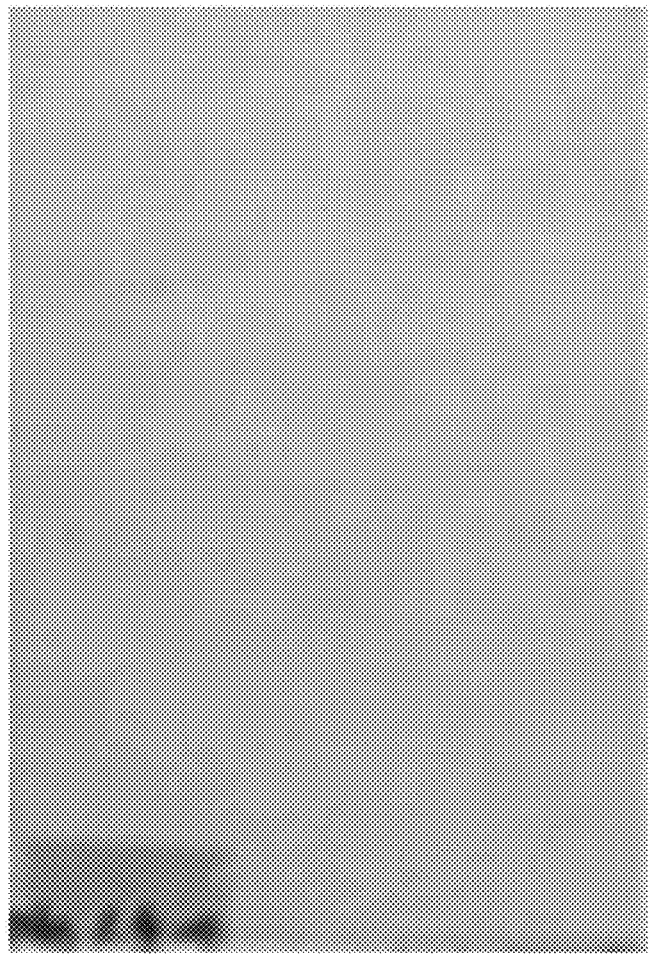
Figure 16:
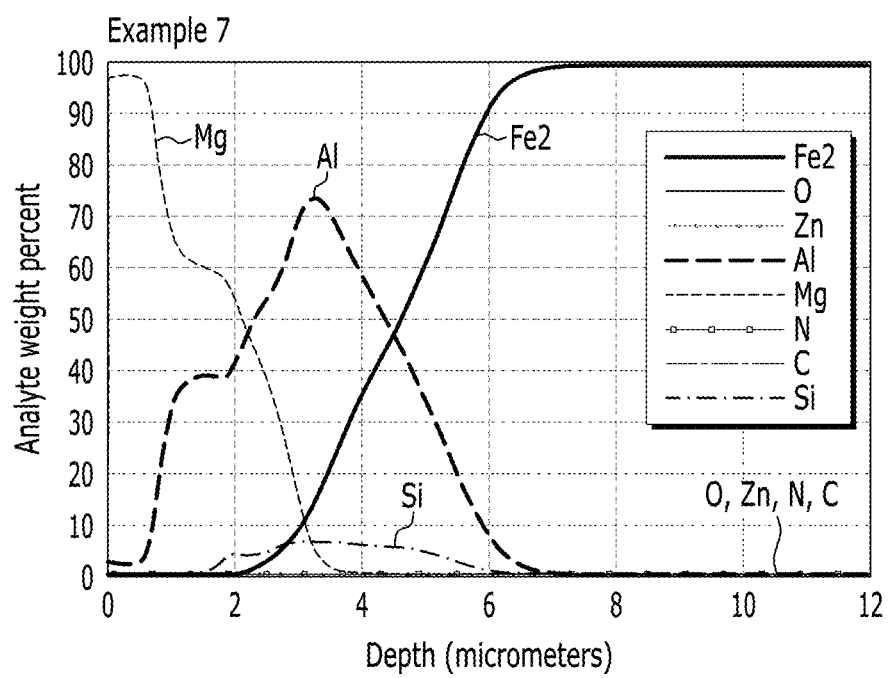
FIGS. 16 and 17 illustrate analysis results and a surface photograph of the alloy components of the plated steel sheet manufactured in Example 7 in the depth direction, respectively.
Figure 17:
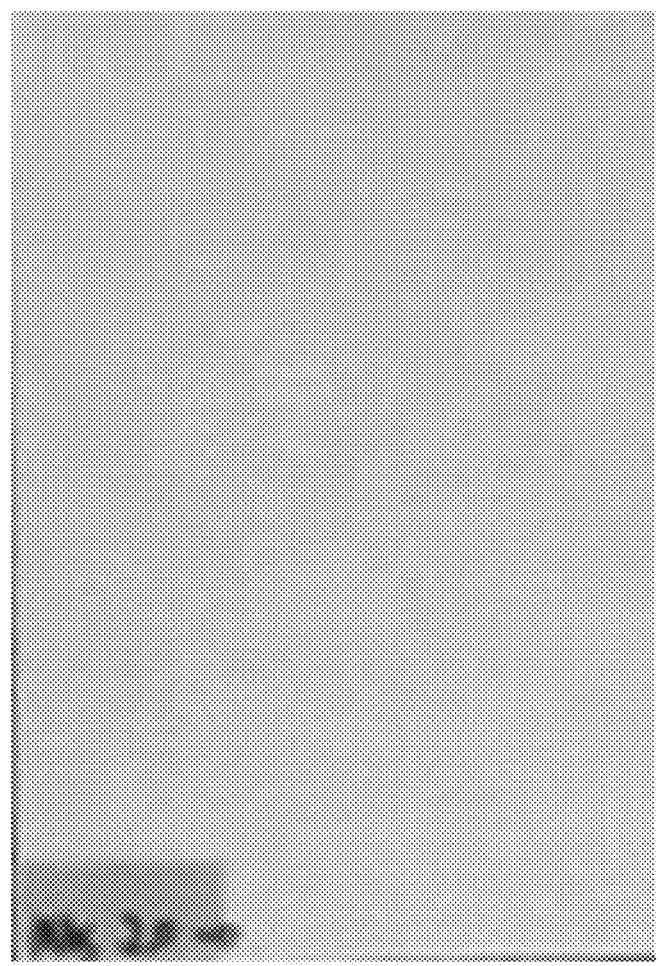
Figure 18:
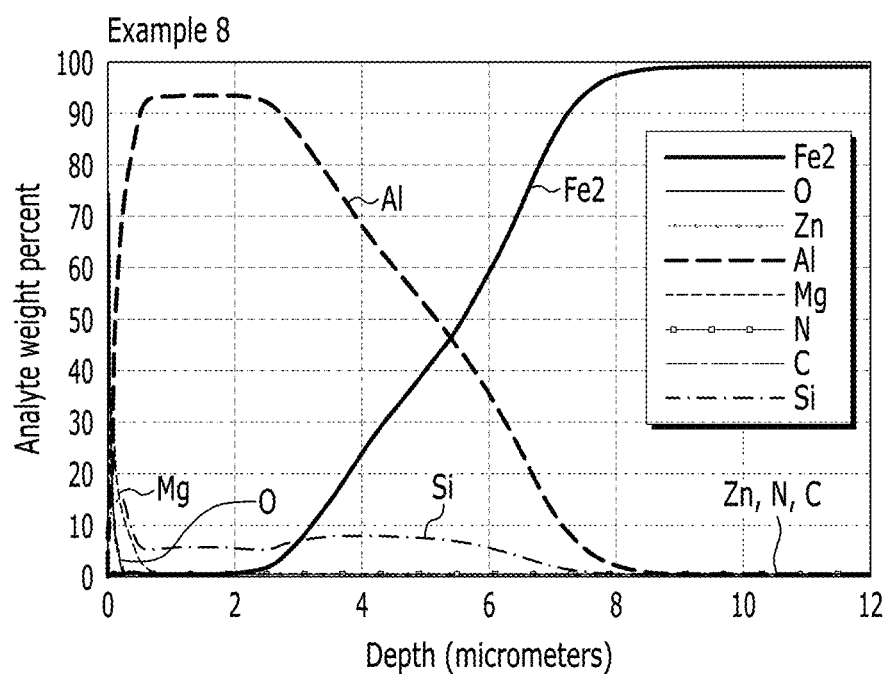
FIGS. 18 and 19 illustrate analysis results and a surface photograph of the alloy components of the black plated steel sheet manufactured in Example 8 in the depth direction, respectively.
Figure 19:
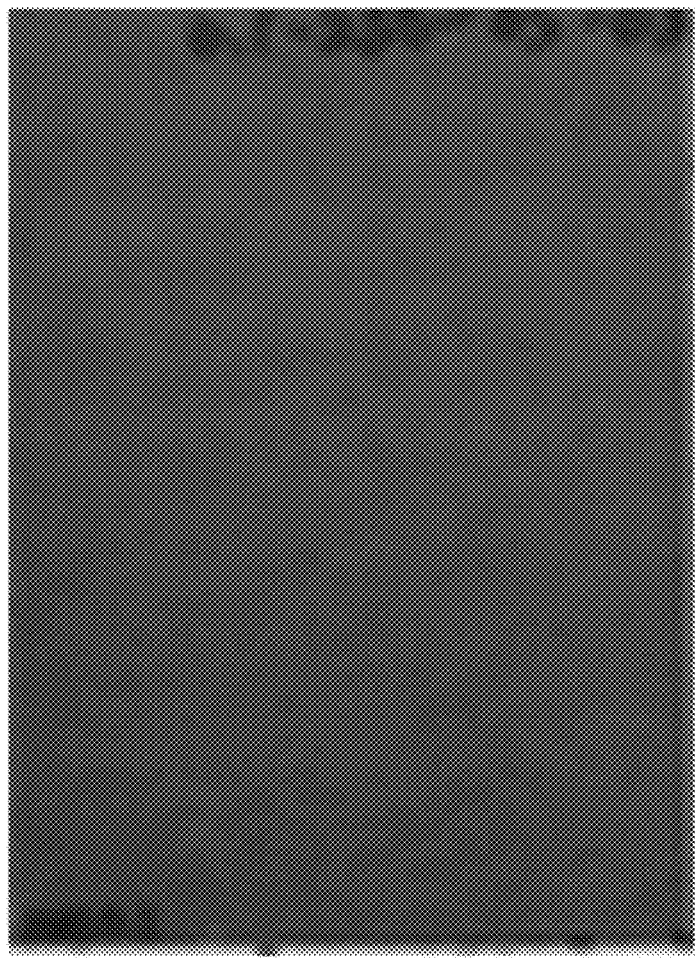
Figure 20:
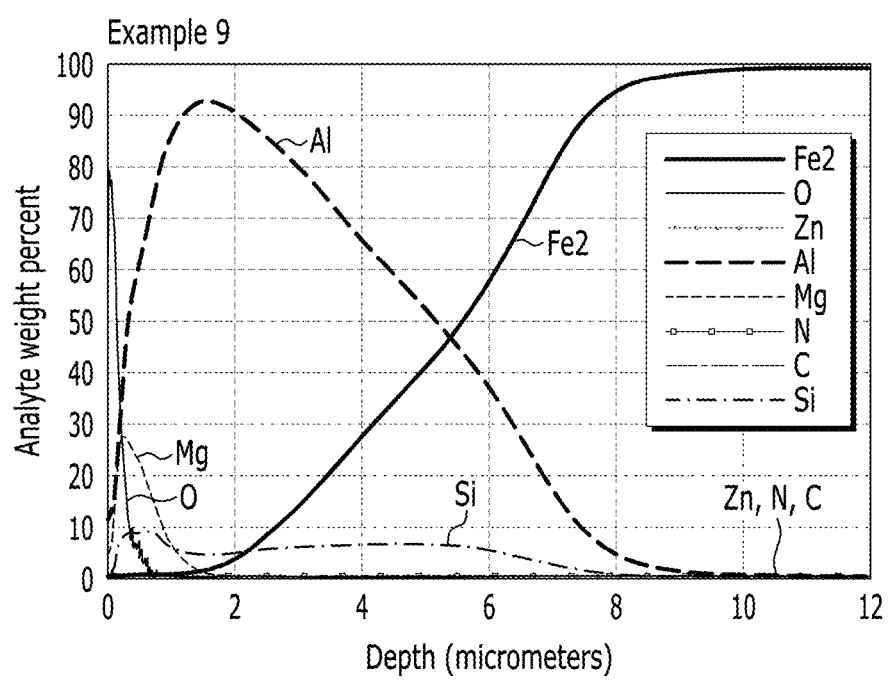
FIGS. 20 and 21 illustrate analysis results and a surface photograph of the alloy components of the black plated steel sheet manufactured in Example 9 in the depth direction, respectively.
Figure 21:
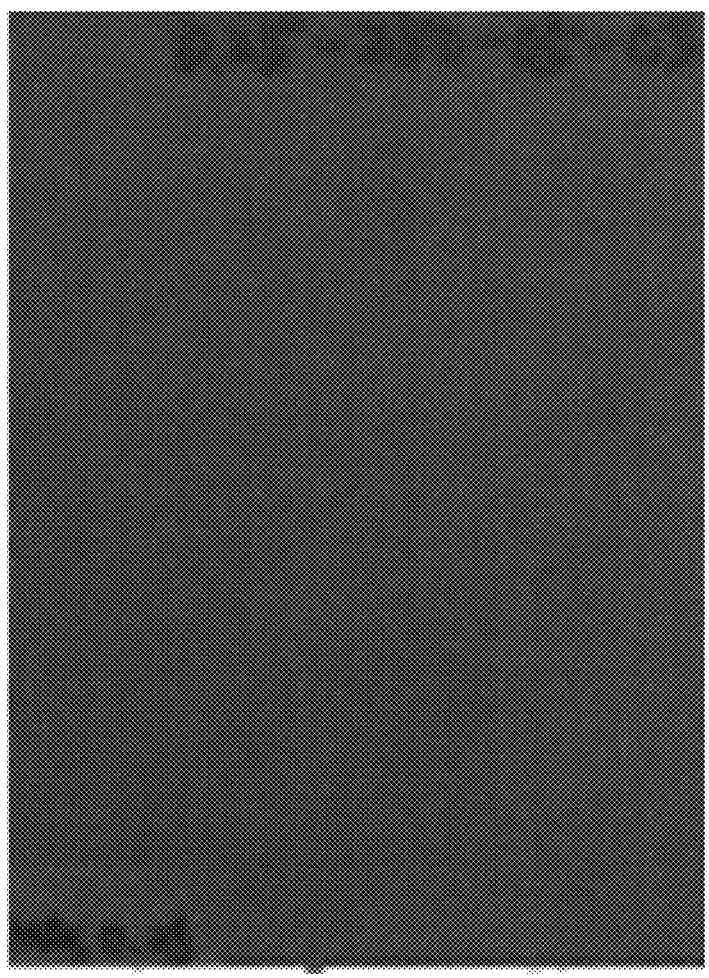
Figure 22:
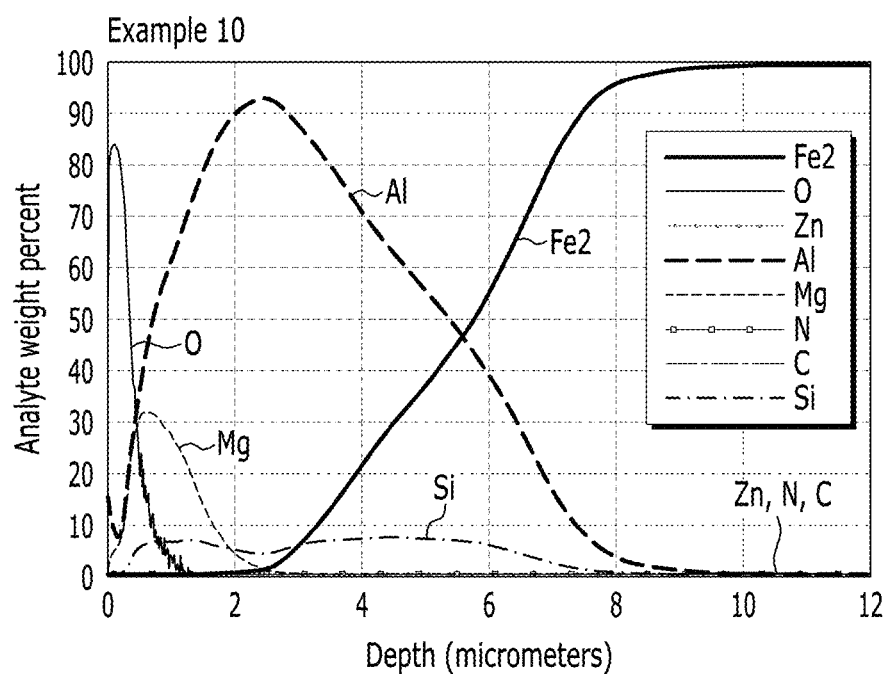
FIGS. 22 and 23 illustrate analysis results and a surface photograph of the alloy components of the black plated steel sheet manufactured in Example 10 in the depth direction, respectively.
Figure 23:
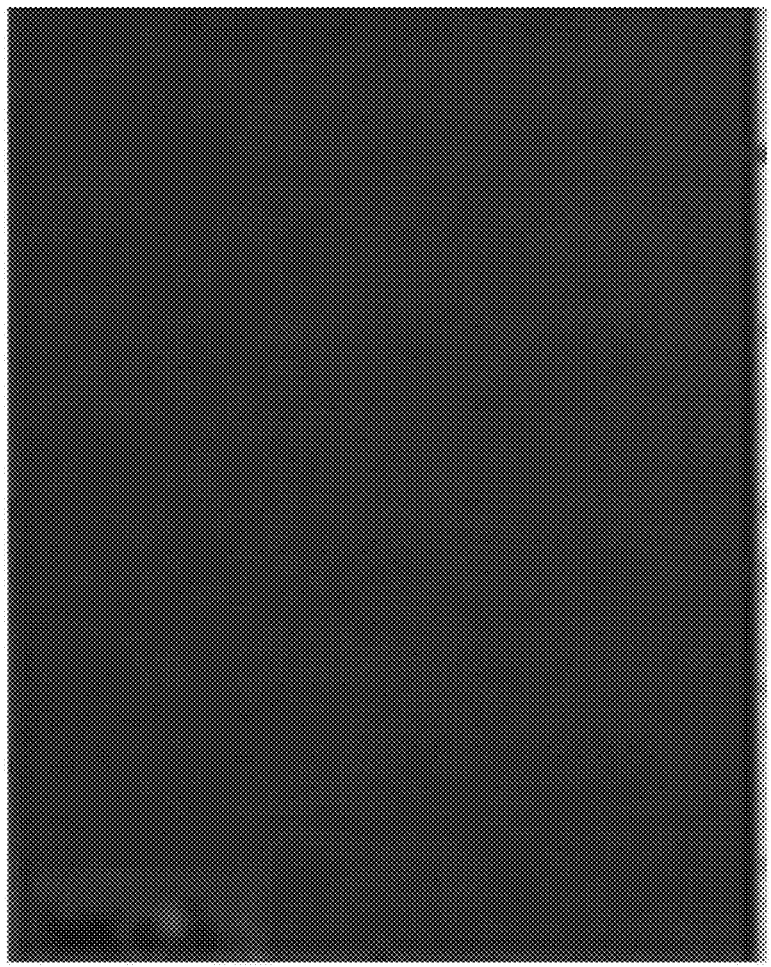
Figure 24:
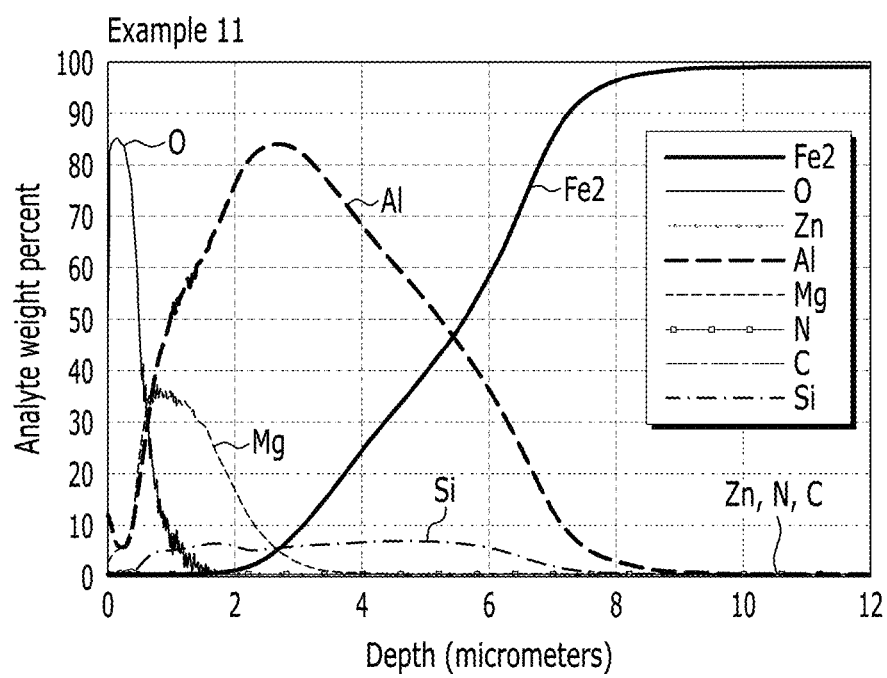
FIGS. 24 and 25 illustrate analysis results and a surface photograph of the alloy components of the black plated steel sheet manufactured in Example 11 in the depth direction, respectively.
Figure 25:
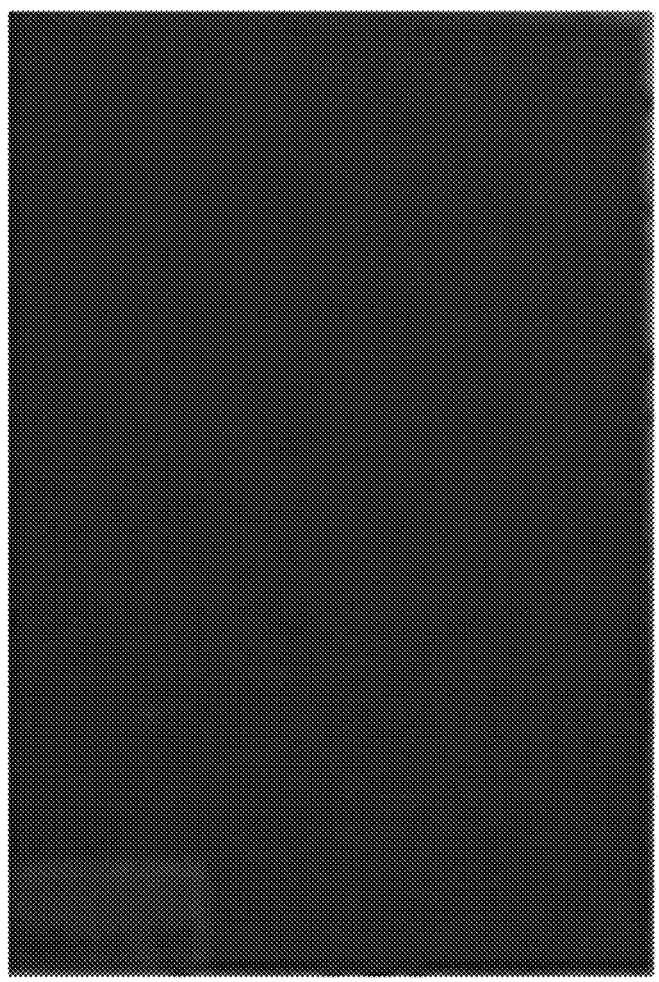
Figure 26:
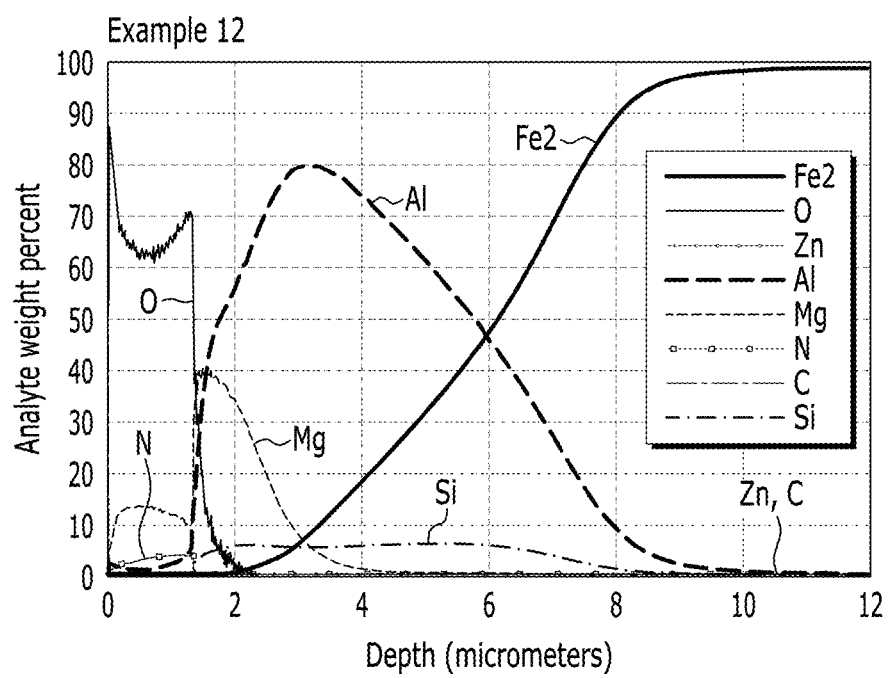
FIGS. 26 and 27 illustrate analysis results and a surface photograph of the alloy components of the black plated steel sheet manufactured in Example 12 in the depth direction, respectively.
Figure 27:
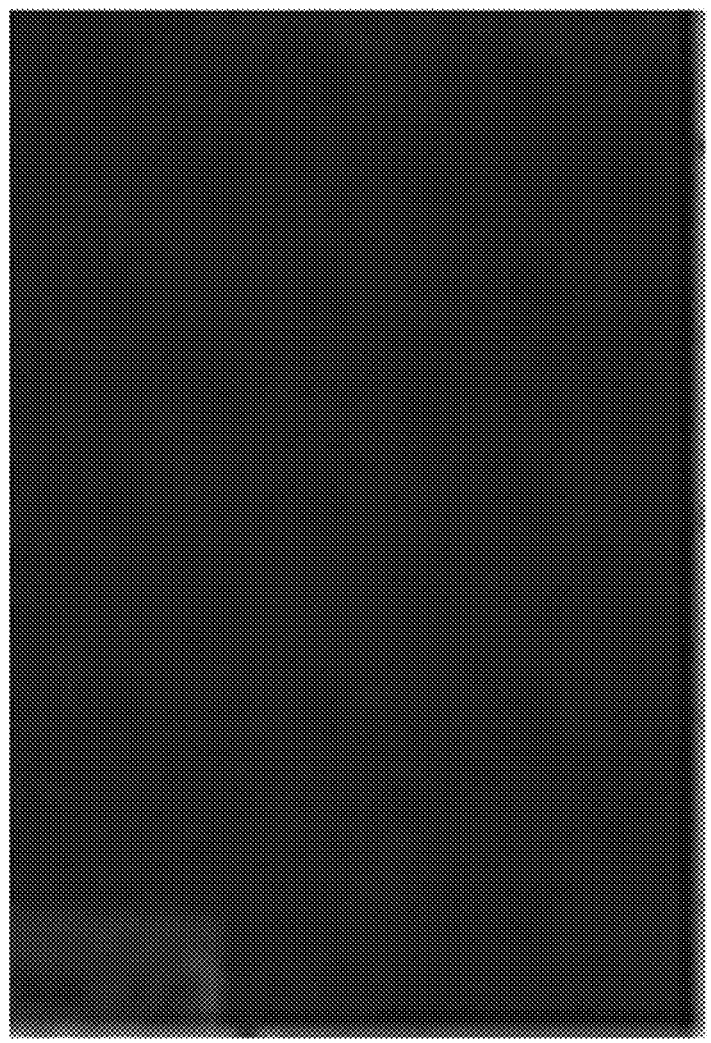
Figure 28:
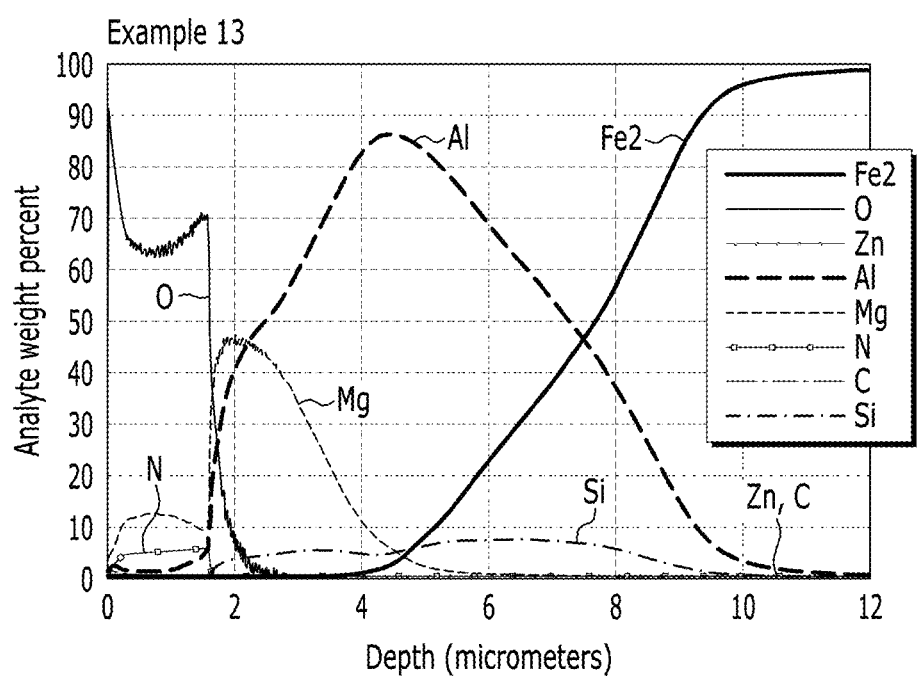
FIGS. 28 and 29 illustrate analysis results and a surface photograph of the alloy components of the black plated steel sheet manufactured in Example 13 in the depth direction, respectively.
Figure 29:
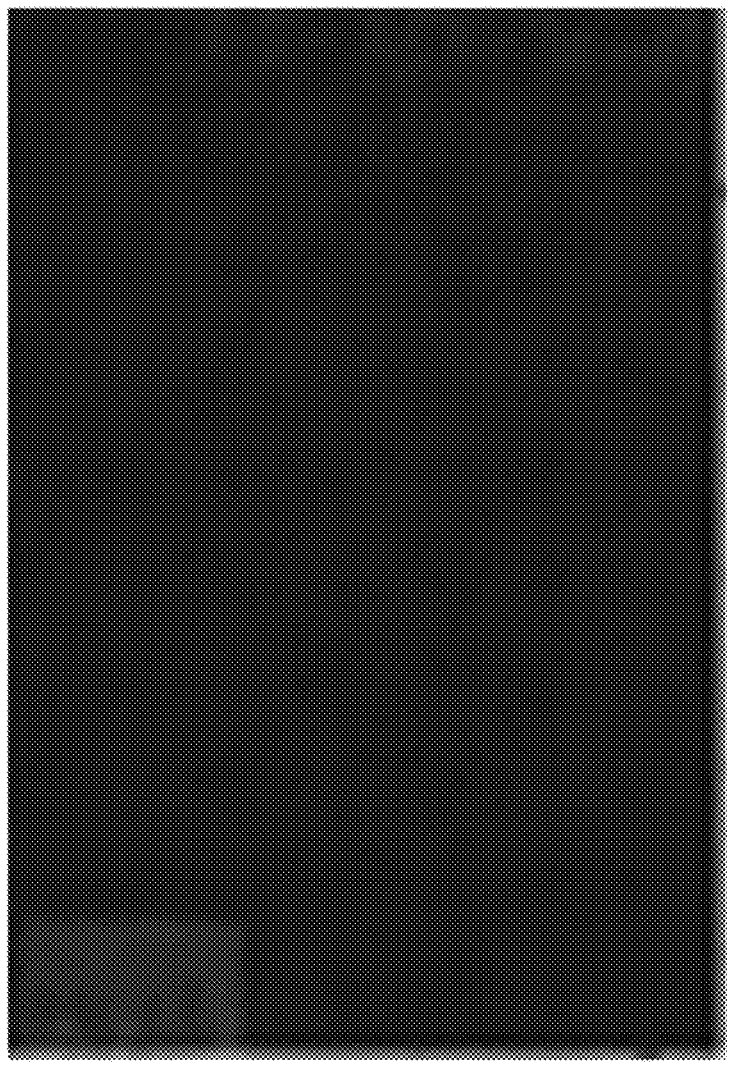
Figure 30:
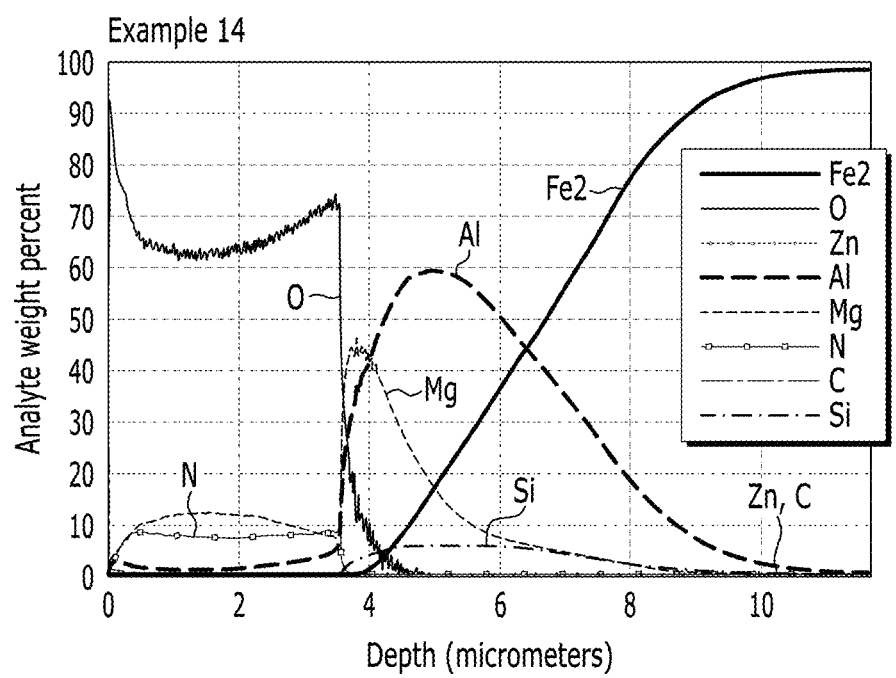
FIGS. 30 and 31 illustrate analysis results and a surface photograph of the alloy components of the black plated steel sheet manufactured in Example 14 in the depth direction, respectively.
Figure 31:
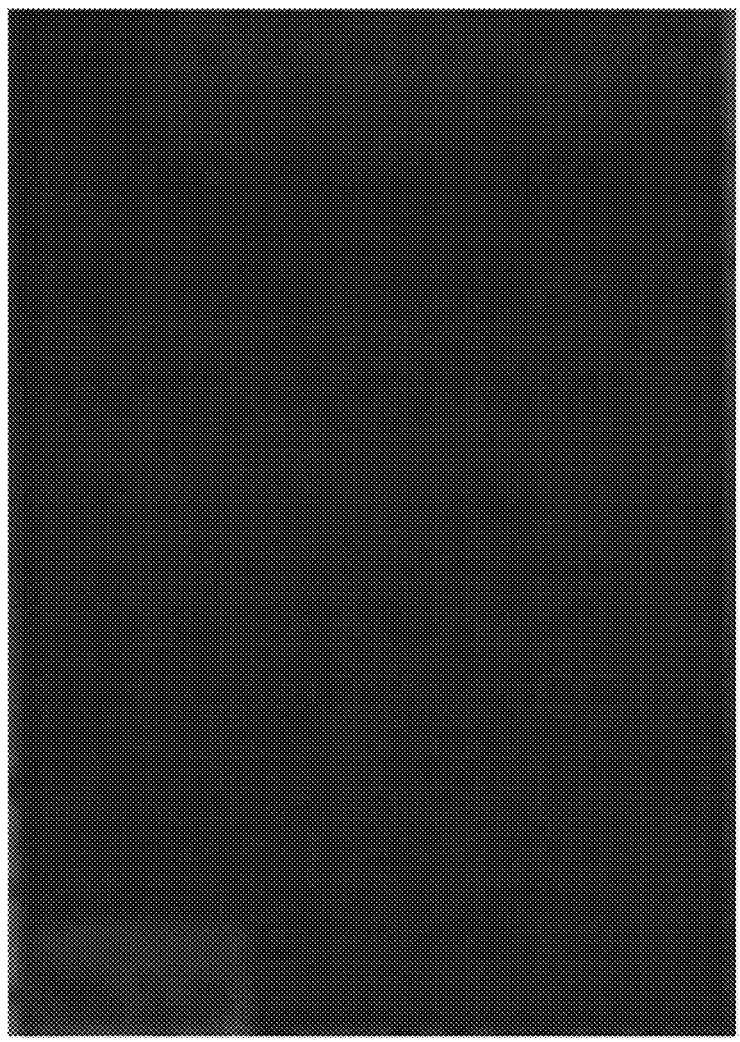

FIG. 3 is a schematic view of the cross-section of a black plated steel sheet according to still another exemplary embodiment of the present invention.

The black plated steel sheet 100 according to another exemplary embodiment of the present invention may further include an inorganic film or an organic film 50 disposed on the Al—Mg—Si-based plating layer.

The inorganic film 50 may include one or more of oxides, oxysalts, hydroxides, phosphates, and fluorides of one or more of Ti, Zr, Hf, V, Nb, Ta, W, Si, and Al.

The organic film 50 may include a urethane resin obtained by reacting a polyol consisting of an ether-based polyol and an ester-based polyol with a polyisocyanate. The proportion of the ether-based polyol in the polyol may be 5 to 30 mass %.

By further forming an inorganic film 50 or an organic film 50, the plating layer 20 may be protected from external impacts and workability during the processing of a product may be improved, and the aesthetic feeling may be enhanced by imparting a translucent color to the inorganic film 50 or the organic film 50, if necessary.

The black plated steel sheet (100) according to an exemplary embodiment of the present invention has excellent corrosion resistance. Specifically, a time for generating white rust of 5% or more of the evaluation sample area by a salt spray test may be 1000 hours or more from a flat sheet.

An exemplary embodiment of the present invention provides a method for manufacturing a black plated steel sheet, the method including: manufacturing an alloy plated steel sheet by forming an Al—Mg—Si-based plating layer on one surface or both surfaces of a steel sheet; a steam introduction step of charging a sealed vessel with the alloy plated steel sheet and introducing steam into the sealed vessel; and heat-treating the alloy plated steel sheet in the sealed vessel.

Hereinafter, each step will be specifically described.

First, an alloy plated steel sheet is manufactured by forming an Al—Mg—Si-based plating layer 20 on one or both sides of a steel sheet 10.

For the steel sheet (10) and the plating layer (20), since the steel sheet 10 and the plating layer 20 has been described above in regard to a black plated steel sheet 100, detailed description thereof will be omitted.

The method for forming the plating layer 20 can be used without particular limitation. Specifically, hot-dip plating, electroplating, vacuum plating and the like may be used.

Specifically, the plating layer 20 may include 40 to 90 wt % of Al, 1 to 40 wt % of Mg, 1 to 15 wt % of Si, and the balance Fe. More specifically, the plating layer 20 may include 40 to 70 wt % of Al, 20 to 40 wt % of Mg, 5 to 15 wt % of Si, and the balance Fe.

The plating layer 20 includes Al, Mg, and Si.

By including Al and Mg in the above range, there is an advantage in that the plated steel sheet is blackened. Further, by including Si in the above-described range, the plated steel sheet is advantageous in terms of white rust resistance.

Fe may diffuse from the steel sheet 10 during the plating process of the plating layer 20. Specifically, 5 to 30 wt % of Fe may be included.

In addition to the above-described elements, N, C, Zn, and the like may be included in an amount of 1 wt % or less. Other inevitable elements may be further included, and since the inevitable elements and content ranges thereof are widely known in the metal field, detailed description thereof will be omitted.

The plating layer 20 means a layer from the outermost surface of the plated steel sheet 100 to the thickness in which Al is included in a larger amount than Fe in the thickness direction. The steel sheet 10 means the internal direction from the point at which Al is present in an amount smaller than or the same as that of Fe.

The plating layer 20 may have a thickness of 5 to 20 μm. When the plating layer 20 is too thin, the corrosion resistance may deteriorate due to the loss of the plating layer during processing such as hairline and vibration for improving the surface design of the plating layer. When the thickness of the plating layer 20 is too thick, conversely, there may occur a problem in that when a black plated steel sheet product is processed, cracks are generated in the plating layer, or the coating layer treated on the plating layer peels off. More specifically, the plating layer 20 may have a thickness of 5 μm to 15 μm.

The plating layer 20 may include an Al—Mg alloy matrix and Mg—Si alloy particles.

A weight ratio of Mg to (Al+Mg) may be 0.05 to 1.00 from the outermost surface of the Al—Mg—Si-based plating layer 20 to a thickness of 2 μm in the internal direction.

When the above ratio is too small, blackening may not be sufficient. When the above ratio is too large, the L value increases from black to gray, and thus, blackening may not be sufficient. More specifically, the weight ratio of Mg to (Al+Mg) may be 0.25 to 0.77. More specifically, the weight ratio may be 0.30 to 0.60.

A weight ratio of Mg to Al may be 0.05 to 5.0 from the outermost surface of the Al—Mg—Si-based plating layer 20 to a thickness of 2 μm in the internal direction. More specifically, the weight ratio may be 0.30 to 3.5.

More specifically, the Al—Mg—Si-based plating layer 20 may include 20 to 90 wt % of Al, 1 to 80 wt % of Mg, and 0.1 to 10 wt % of Si from the outermost surface thereof to a thickness of 2 μm in the internal direction. More specifically, the Al—Mg—Si-based plating layer 20 may include 20 to 70 wt % of Al, 20 to 80 wt % of Mg, and 0.1 to 5.0 wt % of Si from the outermost surface thereof to a thickness of 2 μm in the internal direction.

The alloy plated steel sheet may further include an Al—Si alloy layer 30 or an Al—Fe—Si alloy layer 40 between the Al—Mg—Si-based plating layer 20 and the steel sheet 10. The steel sheet 10, the Al—Si alloy layer 30, the Al—Fe—Si alloy layer 40, and the Al—Mg—Si-based plating layer 20 may be laminated in this order.

The Al—Si alloy layer 30 may include 80 to 95 wt % of Al and 5 to 15 wt % of Si. The Al—Si—Fe alloy layer 40 may include 40 to 55 wt % of Al, 30 to 50 wt % of Fe, and 5 to 15 wt % of Si.

A Mg plating layer may be further included on the Al—Mg—Si-based plating layer 20. The Mg plating layer may include 10 to 30 wt % of Mg and 70 to 90 wt % of O.

Next, a sealed vessel is charged with the alloy plated steel sheet.

Next, steam is introduced into the sealed vessel.

The alloy plated steel sheet may be heat-treated before charging the sealed vessel with the alloy plated steel sheet and introducing steam into the alloy plated steel sheet. Through this, a non-blackened portion may be formed in the blackened layer by at least partially forming $Mg_2Si$.

The heat-treatment step is preferably performed at a temperature higher than the blackening heat treatment temperature in the related art. A heat treatment temperature is 300 to 400° C., preferably 320 to 375° C. A heat treatment is 1 minute to 30 minutes, preferably 3 minutes to 20 minutes, and more preferably 5 minutes to 15 minutes. By the heat-treatment step, $Mg_2Si$ is formed at least partially in the alloy layer on the surface of the steel sheet.

In the subjecting of the plated steel sheet to blackening treatment, as the blackening progresses, the non-blackened portion and the blackened portion are more reliably contrasted, and the pattern may be formed more strongly. Therefore, it can be understood that the degree of blackening and the degree of patterning are proportional to each other.

The degree of blackening may be determined by the thickness of the Mg plating and the heat treatment temperature and time. The thickness of Mg plating and the heat treatment temperature and time may be proportional to the degree of blackening. Therefore, the degree of blackening and the degree of patterning of the plated steel sheet may be variously changed by adjusting the heat treatment temperature and time.

Returning to the description on the steam introduction step again, steam may be introduced such that the pressure in the sealed vessel becomes 3.0 to 10.0 bar at the steam introduction step.

When the pressure is too low, the temperature and humidity conditions are not sufficient so that the time to reach a brightness L value of 60 or less (except for 0) may be delayed. In addition, the surface color of the black layer 21 may not be uniformly blackened, and the internal structure of the black layer 21 may not be formed densely. When the pressure is too high, there may occur a problem in that excessive reaction may cause damage to the plating layer of the top surface. More specifically, steam may be introduced such that the pressure in the sealed vessel becomes 5.0 to 8.0 bar.

Next, the alloy plated steel sheet is heat-treated in the sealed vessel.

In this case, the sealed vessel may be maintained at a humidity of 50 to 100 RH %. When the humidity is too low, a sufficient reaction may not occur, so that the brightness L value may not reach 60 or less (except for 0), or it may take a long time. In addition, the surface color of the black layer 21 may not be uniformly blackened, and the internal structure of the black layer 21 may not be formed densely. More specifically, the sealed vessel may be maintained at a humidity of 85 to 95 RH %.

In the heat-treatment step, the heat treatment temperature may be 100 to 200° C. The heat-treatment step may be performed for 0.5 to 5 hours.

Hereinafter, preferred examples and comparative examples of the present invention will be described. However, the following examples are merely desirable examples of the present invention, and the present invention is not limited to the following examples.

Experimental Example 1—Preparation of Plated Steel Sheet

Example 1

The following Table 1 shows results obtained by calculating a graph area of Al, Mg, and Si components measured from the surface of a plated steel sheet to a thickness of 2 mm using a glow discharge spectrometer (GDS), and calculating this area ratio. The others are Fe, N, C and impurities. The content of each component in Table 1 shows the average value within a thickness of 2 μm.

FIGS. 4 to 17 each show the results and surface photographs of the components of the plating layer manufactured in Examples 1 to 7 from the outermost surface in the depth direction, which are analyzed using a glow discharge spectrometer (GDS).

TABLE 1

| (wt %)    | Al    | Mg    | Si   | Mg/Al | Mg/(Al + Mg) |
|-----------|-------|-------|------|-------|--------------|
| Example 1 | 87.3  | 4.55  | 6.6  | 0.05  | 0.05         |
| Example 2 | 80.6  | 12.3  | 5.75 | 0.15  | 0.13         |
| Example 3 | 69.75 | 23.75 | 4.75 | 0.34  | 0.25         |
| Example 4 | 58.15 | 36.45 | 4.1  | 0.63  | 0.39         |
| Example 5 | 48.75 | 46.75 | 3.55 | 0.96  | 0.49         |
| Example 6 | 36.55 | 60.95 | 1.95 | 1.67  | 0.63         |
| Example 7 | 23.1  | 76    | 0.6  | 3.3   | 0.77         |

Experimental Example 2—Manufacture of Black Plated Steel Sheet

The alloy plated steel sheets manufactured in Examples 1 to 7 were each charged, and steam was introduced into a sealed vessel at 95 RH %, the temperature was maintained at 150° C. while controlling the sealed vessel to maintain a constant humidity, and in this case, the alloy plated steel sheets were subjected to blackening treatment by controlling the pressure to be about 3.5 bar.

According to the blackening treatment, as the plating layer of the plated steel sheet was oxidized, the surface color was converted into a blackened film.

The following Table 2 shows a summary of results of calculating the graph area of Al, Mg, Si and O components from the surface to a thickness of 2 μm from the GDS results of the blackened sample, calculating the values at the ratio for each component, and measuring the white index (L*). The content of each component in Table 2 shows the average value within a thickness of 2 μm.

As can be confirmed in Examples 8 to 14, it can be confirmed that appropriate blackening is performed. Furthermore, as shown in Examples 10 to 14, it can be confirmed that when the ratio of the weight of O to (Al+Mg+Si+O) is further increased, a lower L* value can be obtained.

Figure 32:
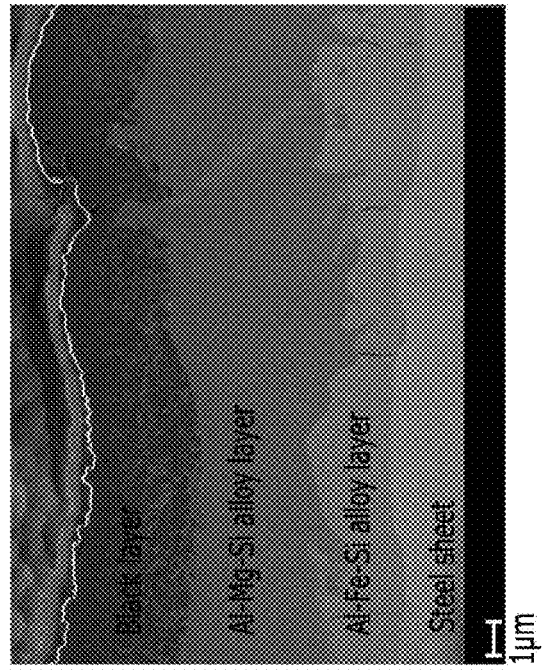
FIG. 32 illustrates scanning electron microscope photographs of a cross section of the plated steel sheet before and after blackening treatment in Examples 5 and 12.
Figure 32:
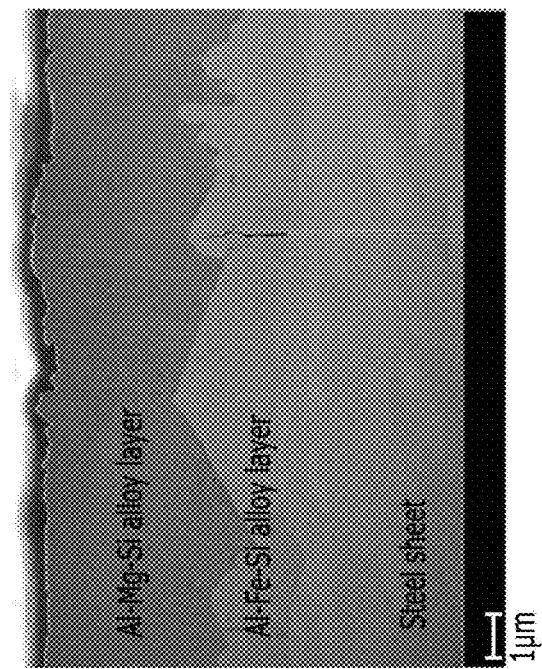

FIG. 32 illustrates a cross section of the plated steel sheet manufactured in Example 5 before blackening treatment and the steel sheet manufactured in Example 12 after blackening treatment. FIG. 32 shows that before blackening treatment, an Al—Si—Mg alloy layer is present on the outermost layer, and the blackening layer consists of a black layer, an Al—Si—Mg alloy layer, and an Al—Fe—Si alloy layer on the outermost surface layer.

Figure 33:
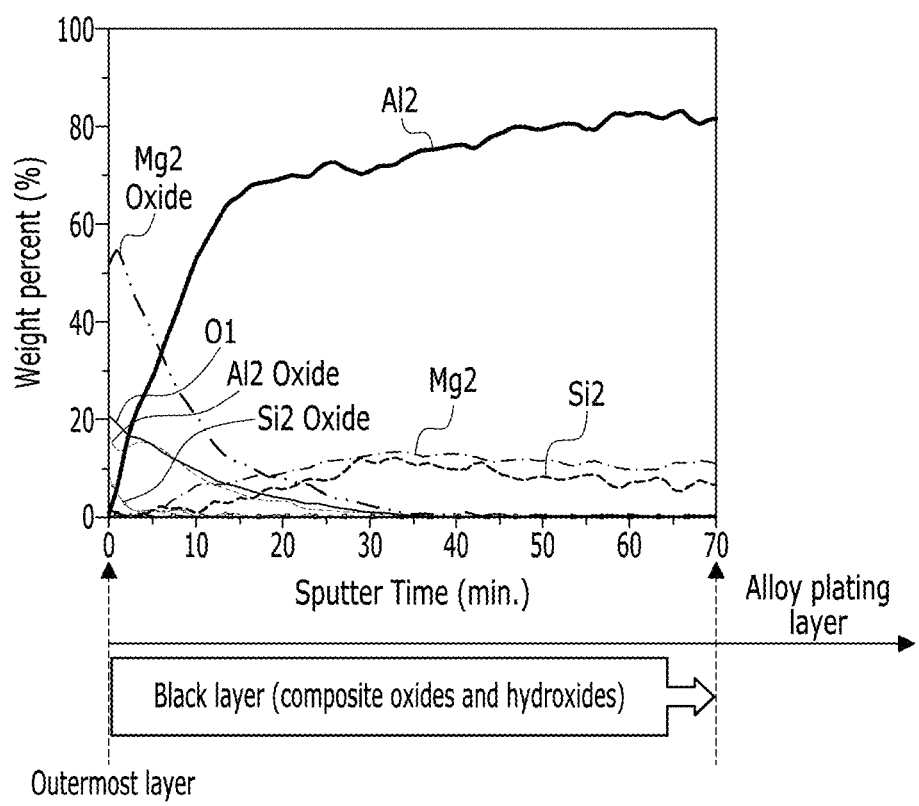
FIG. 33 illustrates the Auger Electron Spectroscopy (AES) analysis results of the black plated steel sheet manufactured in Example 12 in the depth direction.

FIG. 33 illustrates the results of measuring the components from the surface of the black layer manufactured in Example 12 in the depth direction of the plating thickness using the auger electron spectroscopy (AES) analysis method. It was confirmed that the surface consisted of a layer by a composite oxide of Mg, Al, and Si oxides and alloy components, and consisted of an Al—Si—Mg alloy layer and an Al—Fe—Si alloy layer.

Figure 34:
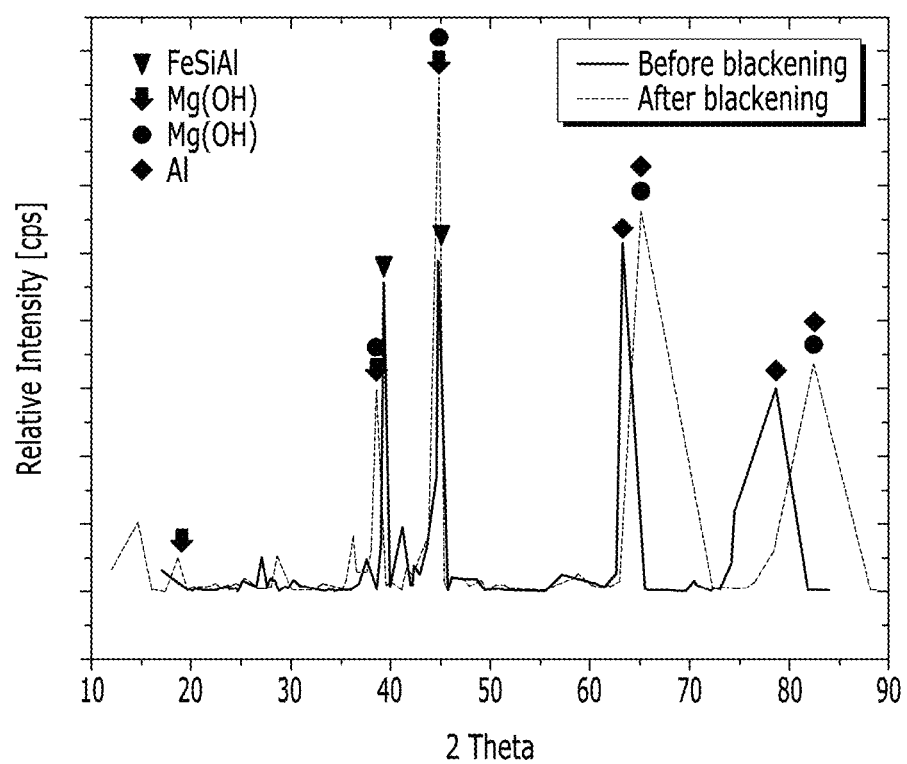
FIG. 34 illustrates the XRD (X-Ray Diffraction) analysis results of the plated steel sheets before and after blackening treatment in Examples 5 and 12.

FIG. 34 illustrates the crystallinity analysis results of the steel sheets manufactured in Examples 5 and 12 using the X-ray diffraction method. It can be confirmed that the crystal structure caused by oxides and hydroxides is detected by blackening.

Experimental Example 3: Evaluation of Corrosion Resistance

Comparative Example 1

A plated steel sheet including 3 wt % of Zn, 2.5 wt % of Mg, and the balance Al was used as the plating layer.

A black plated steel sheet was manufactured by performing blackening treatment in the same method as in Examples 8 to 14.

By the salt spray test, the white rust occurrence time of 5% or more of the evaluation sample area was confirmed.

It was confirmed that white rust was generated after about 240 hours in Comparative Example 1, whereas white rust was not generated even after about 960 hours in Example 12.

Figure 35:
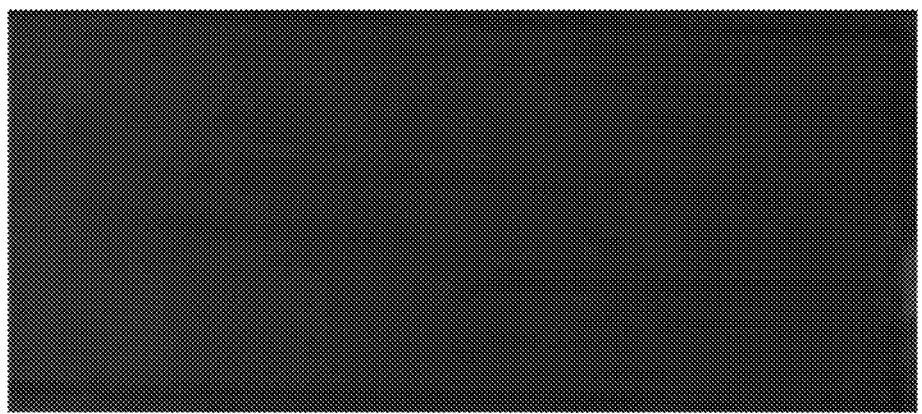
FIG. 35 is a photograph of the black plated steel sheet manufactured in Example 12 after evaluation of corrosion resistance.
Figure 36:
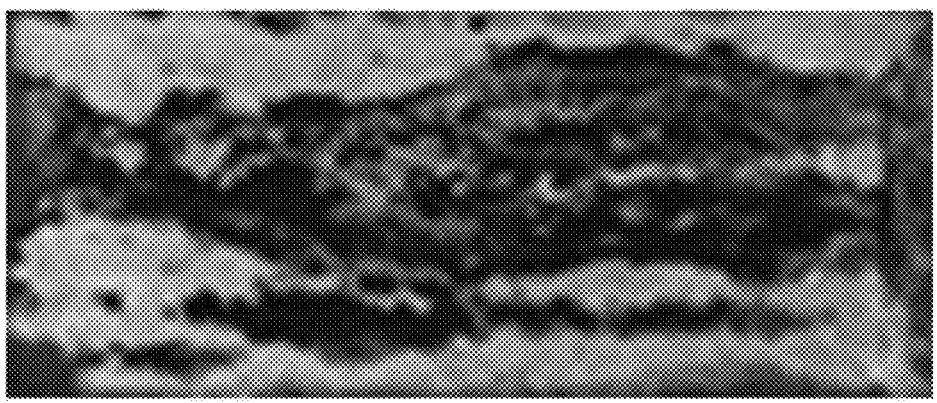
FIG. 36 is a photograph of the black plated steel sheet manufactured in Comparative Example 1 after evaluation of corrosion resistance.
Figure 37:
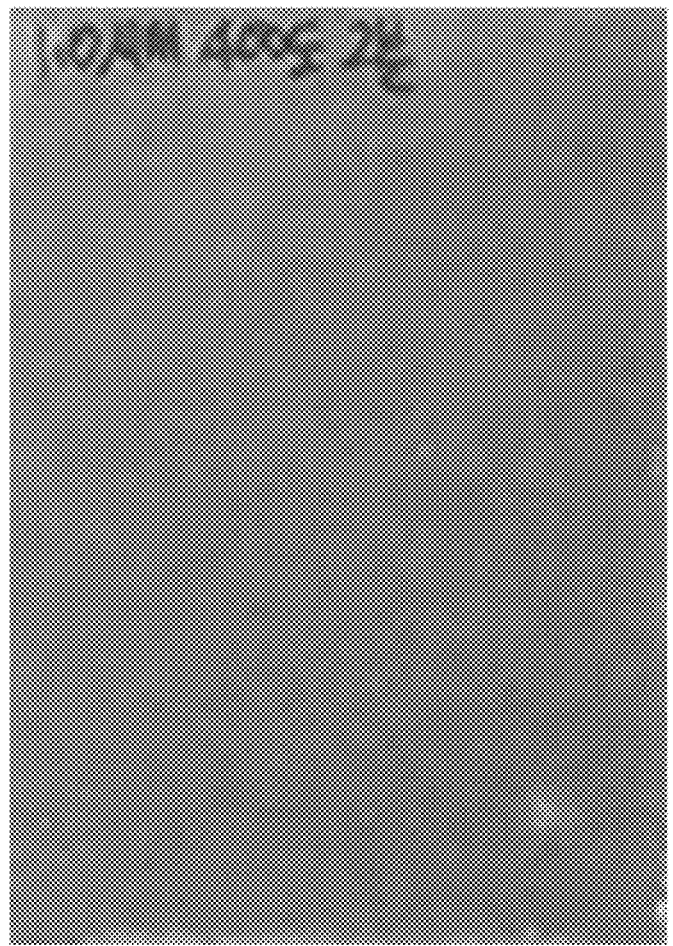
FIGS. 37 to 45 are photographs of the surfaces of the plated steel sheets manufactured in Examples 15 to 23, respectively.
Figure 38:
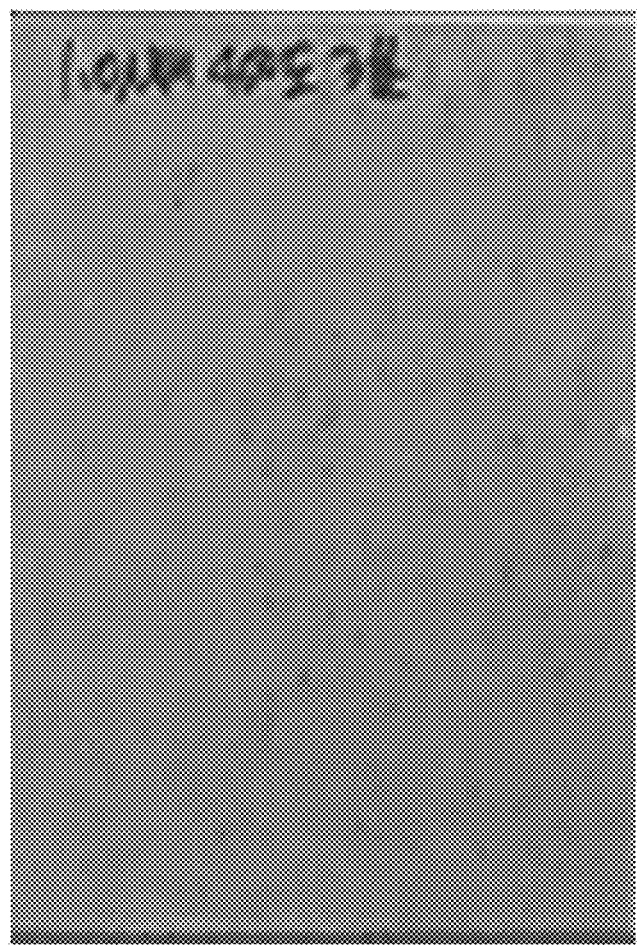
Figure 39:
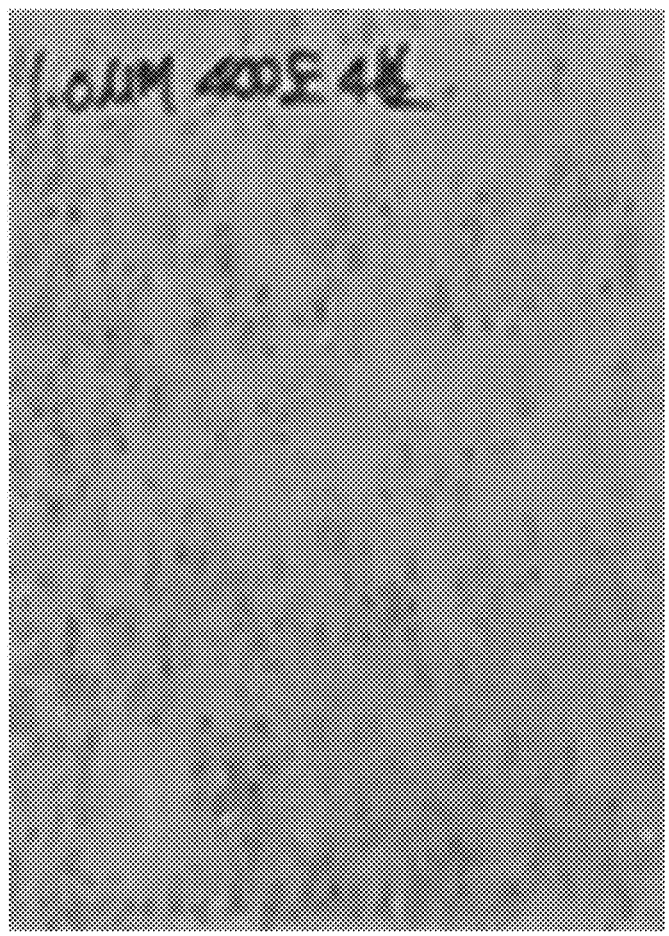
Figure 40:
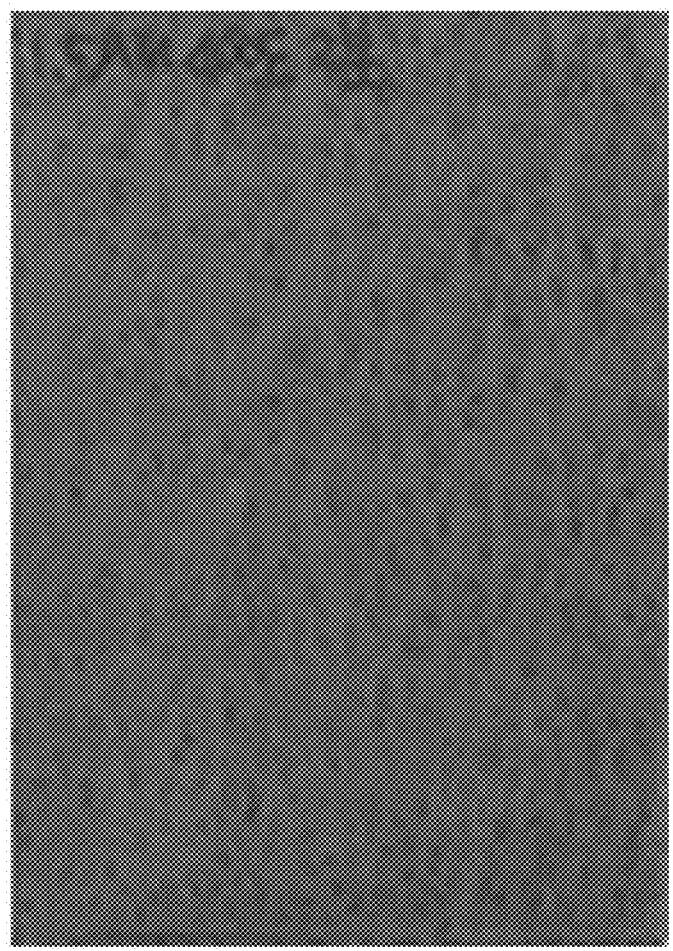
Figure 41:
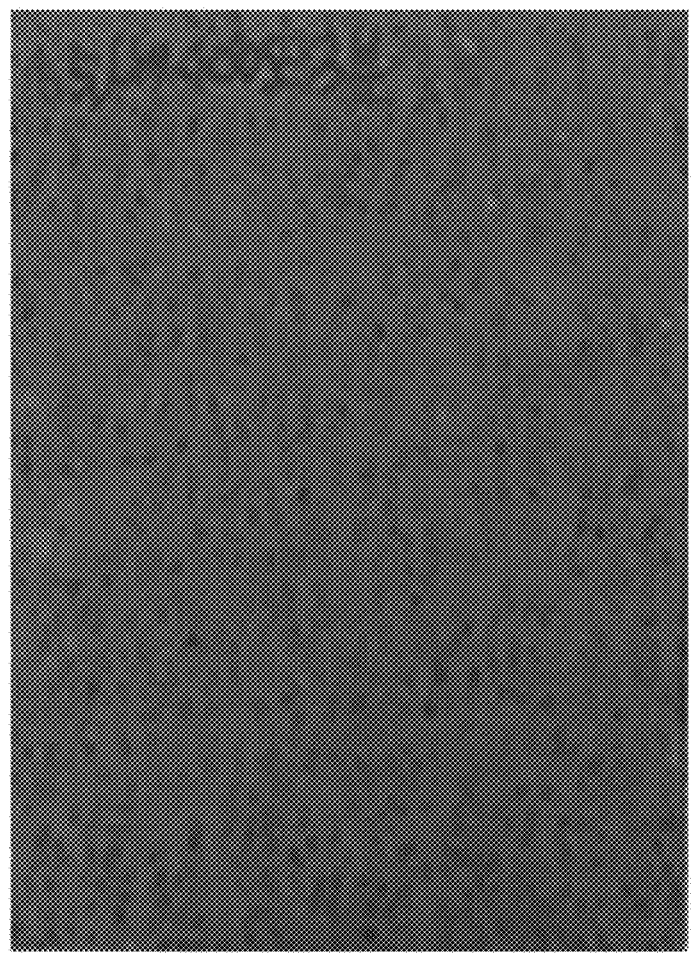
Figure 42:
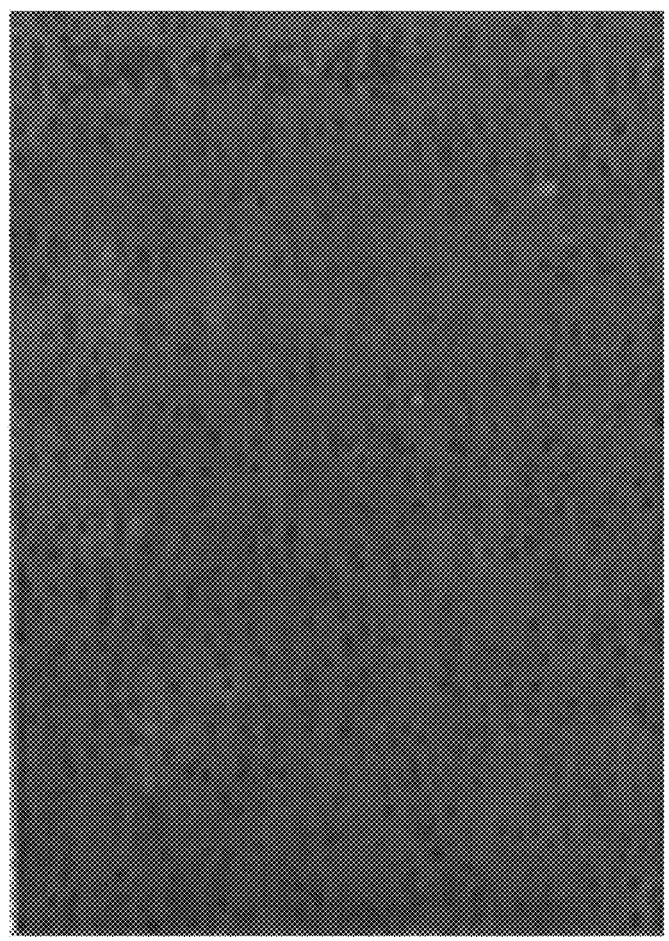
Figure 43:
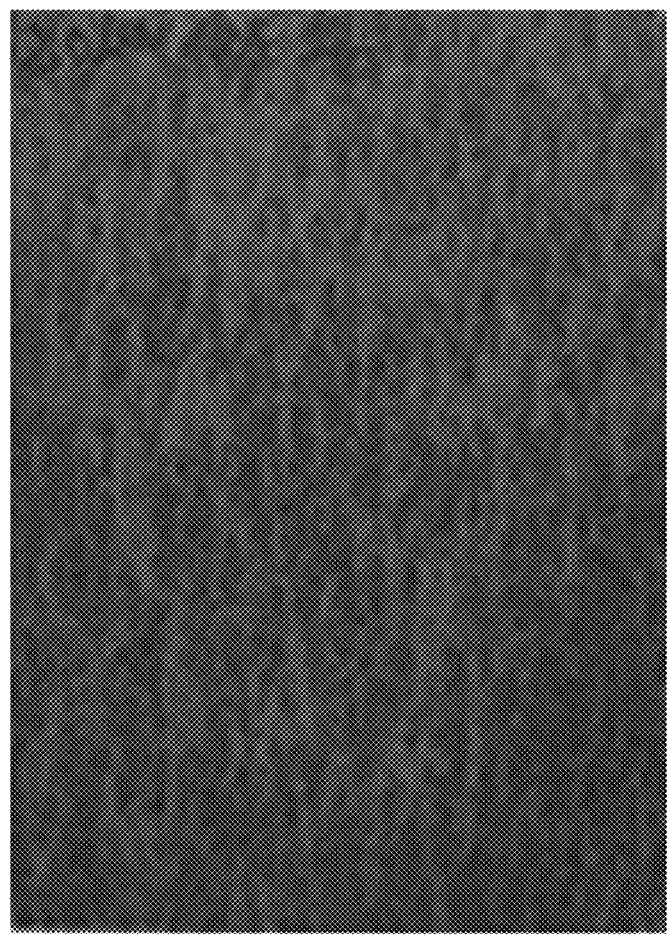
Figure 44:
Figure 45:
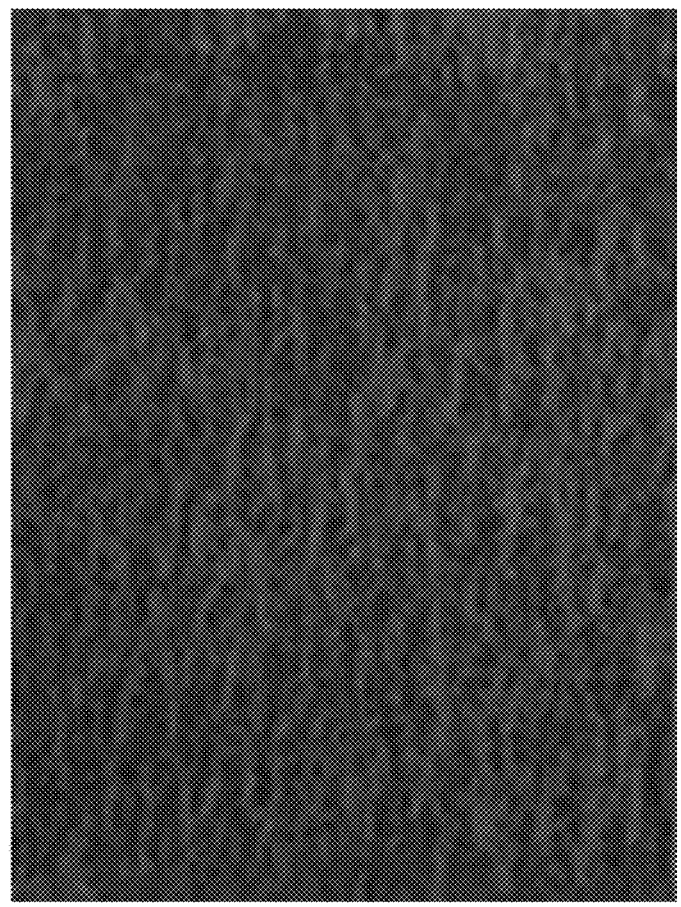

FIGS. 35 and 36 are surface photographs of Example 12 and Comparative Example 1 after 720 hours after the salt spray test, respectively.

It can be confirmed that white rust is not generated at all in Example 12, whereas white rust is generated in the entire steel sheet in Comparative Example 1.

TABLE 2

| (wt %)     | Al   | Mg   | Si  | O    | Mg/Al | Mg/(Al + Mg) | O/(Al + Mg + Si + O) | L* value |
|------------|------|------|-----|------|-------|--------------|----------------------|----------|
| Example 8  | 87.2 | 3.8  | 6.9 | 2.1  | 0.04  | 0.04         | 0.02                 | 52.2     |
| Example 9  | 75.5 | 9.8  | 6.0 | 8.7  | 0.13  | 0.11         | 0.09                 | 45.8     |
| Example 10 | 56.8 | 18.8 | 5.1 | 19.3 | 0.33  | 0.25         | 0.19                 | 38.6     |
| Example 11 | 44.2 | 25.0 | 4.0 | 26.8 | 0.57  | 0.36         | 0.27                 | 32.3     |
| Example 12 | 17.7 | 23.4 | 1.8 | 57.1 | 1.33  | 0.57         | 0.57                 | 30.6     |
| Example 13 | 14.6 | 47.9 | 0.4 | 37.1 | 3.29  | 0.77         | 0.37                 | 27.8     |
| Example 14 | 0.8  | 59.6 | 0.1 | 39.5 | 71.71 | 0.99         | 0.39                 | 29.5     |

Experimental Example 3—Formation of Non-Black Portion in Black Plating

Examples 15 to 23

Nine steel sheets including an Al plating layer including 9 wt % of Si, 88 wt % of Al, and the balance Fe were prepared on a cold-rolled steel sheet. An Al plating layer was coated with Mg such that a vacuum plated thickness was 1.0 μm, 1.5 μm, and 2.0 μm per three Al plating layers by an electromagnetic levitation source installed in a vacuum vessel while supplying the steel sheets into the vacuum vessel by a supply device. After the coating was completed, the steel sheets were continuously moved and discharged into the atmosphere, and then each steel sheet was heat-treated at 400° C. for 2, 3 and 4 minutes using an induction heating device in the atmosphere. After the heat treatment was completed, the steel sheet was continuously transferred to obtain the manufactured alloy coated steel sheet. After supplying these steel sheets into the vacuum vessel again, steam was added thereto at 150° C. under 95% relative humidity. As can be seen in FIGS. 37 to 45, a patterned blackened plated steel sheet in which various blackened-non-blackened portions are non-uniformly formed has been obtained. In the following Table 3, the degrees of blackening and patterning according to each example are shown by relative intensity.

TABLE 3

| Remark | Mg vacuum plated thickness (μm) | Heat treatment temperature(° C.) | Heat treatment time (min) | Degree of blackening | Degree of patterning |
|---|---|---|---|---|---|
| Example 15 | 1 | 400 | 2 | Weak | Weak |
| Example 16 | 1 | 400 | 3 | Weak | Medium |
| Example 17 | 1 | 400 | 4 | Weak | Strong |
| Example 18 | 1.5 | 400 | 2 | Medium | Weak |
| Example 19 | 1.5 | 400 | 3 | Medium | Medium |
| Example 20 | 1.5 | 400 | 4 | Medium | Strong |
| Example 21 | 2 | 400 | 2 | Strong | Weak |
| Example 22 | 2 | 400 | 3 | Strong | Medium |
| Example 23 | 2 | 400 | 4 | Strong | Strong |

Figure 46:
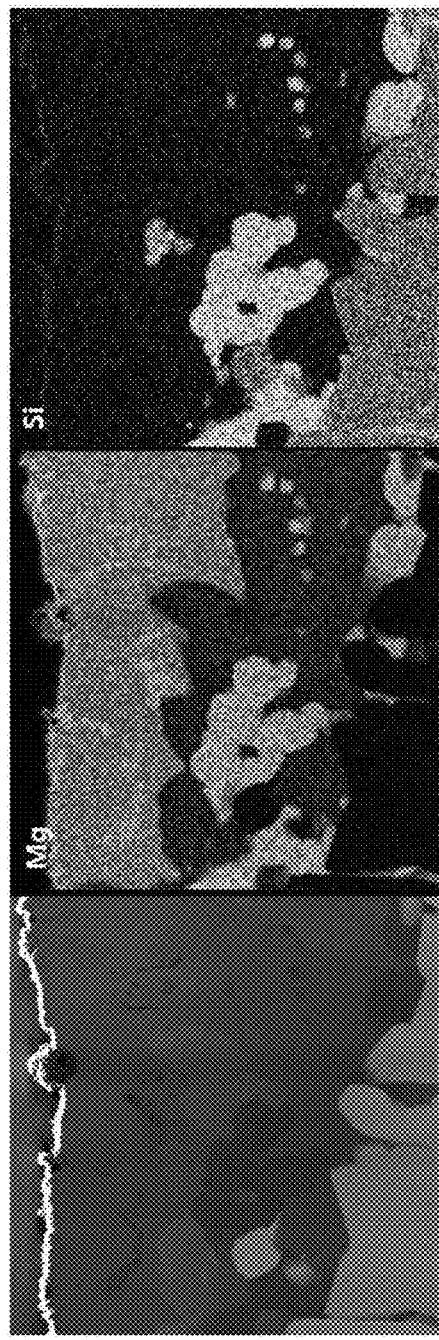
FIG. 46 illustrates photographs of the non-black portion of the plated steel sheet manufactured in Example 23, which is analyzed by TEM-EDS.
Figure 47:
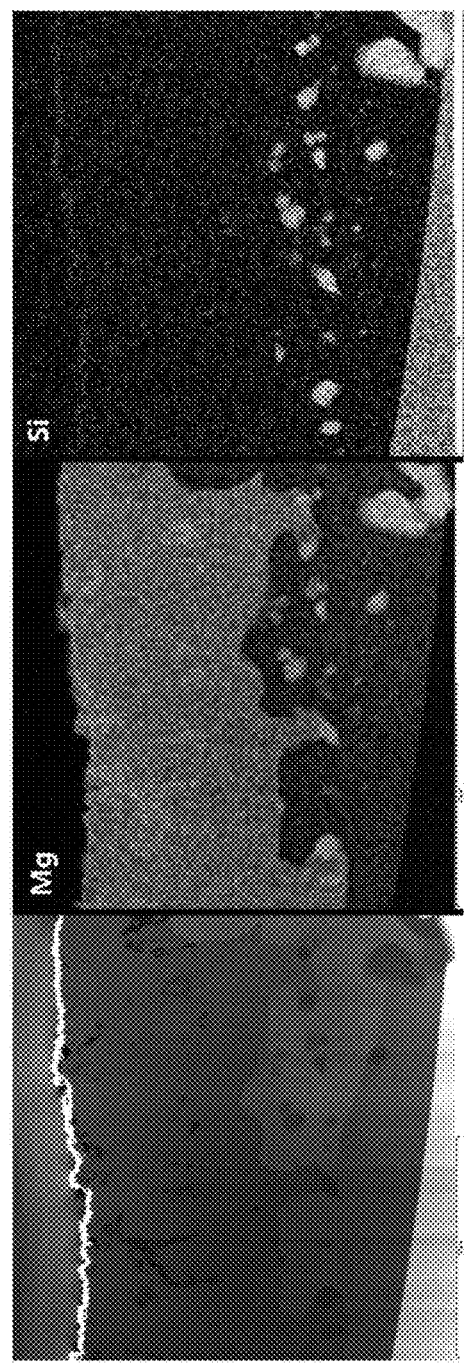
FIG. 47 illustrates photographs of the black portion of the plated steel sheet manufactured in Example 23, which is analyzed by TEM-EDS.

As shown in Table 3 above, the overall degree of blackening of the plated steel sheet was proportional to the thickness of Mg vacuum plating. However, it was found that the pattern intensities of the non-blackened portion and the blackened portion are proportional to the heat treatment time in the plated steel sheet having each Mg vacuum plating thickness. The blackened and non-blackened portions were observed by TEM-EDS. The results are illustrated in FIGS. 46 and 47. FIG. 46 illustrates the TEM-EDS results of the gray portion (non-blackened portion) after the blackening process, and it could be seen that the portion where $Mg_2Si$ was present was inhibited from blackening to form a gray portion. FIG. 47 illustrates the TEM-EDS results of the black portion after the blackening process, and it could be seen that the more the Mg, the stronger the blackening.

Comparative Example 2

Figure 48:
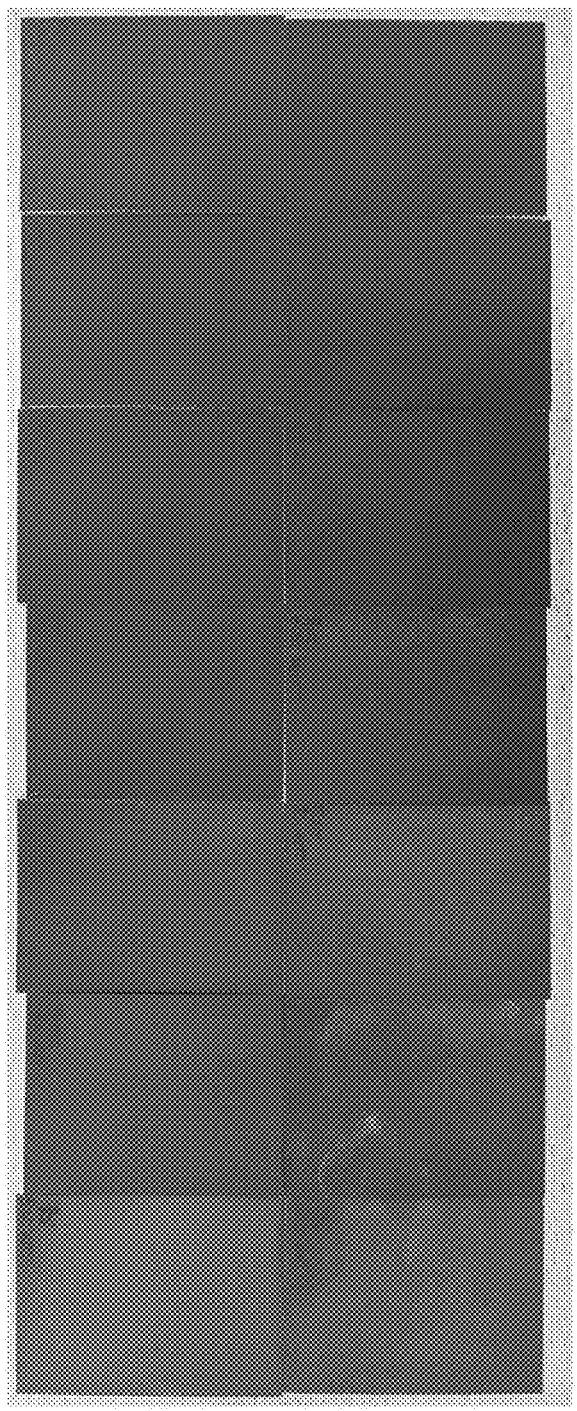
FIG. 48 is a photograph of the surfaces of the plated steel sheets manufactured in Comparative Example 2.

The same processes as in Examples 15 to 23 were applied, but the heat-treatment step after Mg PVD vacuum plating was performed at 250° C. for 60 minutes. After the heat treatment, a treatment as a blackening process was performed at 150° C., 95% RH for 1 hour, and then the degree of blackening of the surface of the plated steel sheet was observed. As shown in FIG. 48, there was no non-blackening portion on the surface, and a uniform black appearance without a pattern could be confirmed.

The present invention is not limited to the Examples and can be manufactured in various different forms, and it will be understood by those skilled in the art to which the present invention pertains that the present invention can be implemented in other concrete forms without modifying the technical spirit or essential features of the present invention. Therefore, it should be understood that the examples described above are exemplary in all respects and are not limiting.

<Description of symbols>

| | |
|---|---|
| 100: Black plated steel sheet, | 10: Steel sheet, |
| 20: Al—Mg—Si-based plating layer, | 21: Black layer, |
| 30: Al—Si alloy layer, | 40: Al—Si—Fe alloy layer, |
| 50: Film | |

The invention claimed is:

1. A black plated steel sheet comprising: a steel sheet and an Al—Mg—Si-based plating layer disposed on one surface or both surfaces of the steel sheet,
   wherein the Al—Mg—Si-based plating layer comprises: a black layer, the black layer being located from an outermost surface of the Al—Mg—Si-based plating layer in an internal direction of the Al—Mg—Si-based plating layer, and
   a weight ratio of O to (Al+Mg+Si+O) is 0.01 to 0.6 from the outermost surface of the Al—Mg—Si-based plating layer to a thickness of 2 μm in the internal direction.

2. The black plated steel sheet of claim 1, wherein:
   the black layer comprises a black portion and a non-black portion, and
   the non-black portion consists of $Mg_2Si$.

3. The black plated steel sheet of claim 1, wherein:
   the black layer comprises Si oxides, Si—Al composite oxides, Si—Mg composite oxides, or Si—Al—Mg composite oxides, or hydroxides thereof.

4. The black plated steel sheet of claim 1, wherein:
   the black layer further comprises Mg oxides, Al oxides, or Mg—Si composite oxides, or hydroxides thereof.

5. The black plated steel sheet of claim 1, wherein:
   the black layer comprises 60 to 85 wt % of O.

6. The black plated steel sheet of claim 5, wherein:
   the black layer further comprises 5 to 15 wt % of Al, 5 to 30 wt % of Mg, and 0.1 to 10 wt % of Si.

7. The black plated steel sheet of claim 1, wherein:
   the black layer has a thickness of 0.5 to 5 μm.

8. The black plated steel sheet of claim 1, wherein:
   the black layer has a brightness L* of 60 or less.

9. The black plated steel sheet of claim 1, wherein:
   the Al—Mg—Si-based plating layer comprises an Al—Mg alloy matrix and Mg—Si alloy particles.

10. The black plated steel sheet of claim 1, wherein:
    the Al—Mg—Si-based plating layer comprises 40 to 90 wt % of Al, 1 to 40 wt % of Mg, 1 to 15 wt % of Si, and the balance Fe.

11. The black plated steel sheet of claim 1,
    further comprising an Al—Si alloy layer or an Al—Fe—Si alloy layer between the Al—Mg—Si-based plating layer and the steel sheet.

12. The black plated steel sheet of claim 1,
further comprising an inorganic film or an organic film disposed on the Al—Mg—Si-based plating layer.

13. The black plated steel sheet of claim 12, wherein:
the inorganic film comprises one or more of oxides, oxysalts, hydroxides, phosphates, and fluorides of one or more of Ti, Zr, Hf, V, Nb, Ta, W, Si, and Al.

14. The black plated steel sheet of claim 12, wherein:
the organic film comprises a urethane resin obtained by reacting a polyol consisting of an ether-based polyol and an ester-based polyol with a polyisocyanate.

* * * * *